(12) United States Patent
Mauder et al.

(10) Patent No.: US 9,997,517 B2
(45) Date of Patent: Jun. 12, 2018

(54) POWER SEMICONDUCTOR DEVICE HAVING FULLY DEPLETED CHANNEL REGIONS

(71) Applicant: Infineon Technologies AG, Neubiberg (DE)

(72) Inventors: Anton Mauder, Kolbermoor (DE); Franz-Josef Niedernostheide, Hagen a. T.W. (DE); Christian Philipp Sandow, Haar (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/635,987

(22) Filed: Jun. 28, 2017

(65) Prior Publication Data
US 2018/0006027 A1   Jan. 4, 2018

(30) Foreign Application Priority Data
Jun. 30, 2016 (DE) .................. 10 2016 112 018

(51) Int. Cl.
| *H01L 27/088* | (2006.01) |
| *H01L 29/08* | (2006.01) |
| *H01L 29/10* | (2006.01) |
| *H01L 29/06* | (2006.01) |
| *H01L 29/423* | (2006.01) |
| *H01L 29/32* | (2006.01) |

(52) U.S. Cl.
CPC ........ *H01L 27/088* (2013.01); *H01L 29/0607* (2013.01); *H01L 29/0696* (2013.01); *H01L 29/0878* (2013.01); *H01L 29/105* (2013.01); *H01L 29/1095* (2013.01); *H01L 29/32* (2013.01); *H01L 29/4238* (2013.01)

(58) Field of Classification Search
CPC . H01L 29/1095; H01L 29/32; H01L 29/0696; H01L 27/088; H01L 29/0878; H01L 29/0607; H01L 29/105
See application file for complete search history.

(56) References Cited

U.S. PATENT DOCUMENTS

| 7,211,861 | B2 | 5/2007 | Teramae et al. |
| 9,214,521 | B2 | 12/2015 | Werber et al. |
| 9,419,080 | B2 | 8/2016 | Laven et al. |
| 9,525,029 | B2 | 12/2016 | Sandow et al. |
| 2006/0001084 | A1* | 1/2006 | Kelly ............... H01L 29/407 257/329 |

* cited by examiner

*Primary Examiner* — Jasmine Clark
(74) *Attorney, Agent, or Firm* — Dicke, Billig & Czaja, PLLC

(57) ABSTRACT

A power semiconductor device is disclosed. In one example, the device includes a semiconductor body coupled to a first load terminal structure and a second load terminal structure. An active cell field is implemented in the semiconductor body. The active cell field is surrounded by an edge termination zone. A plurality of first cells and a plurality of second cells are provided in the active cell field. Each first cell includes a first mesa, the first mesa including: a first port region and a first channel region. Each second cell includes a second mesa, the second mesa including a second port region. The active cell field is surrounded by a drainage region that is arranged between the active cell field and the edge termination zone.

20 Claims, 19 Drawing Sheets

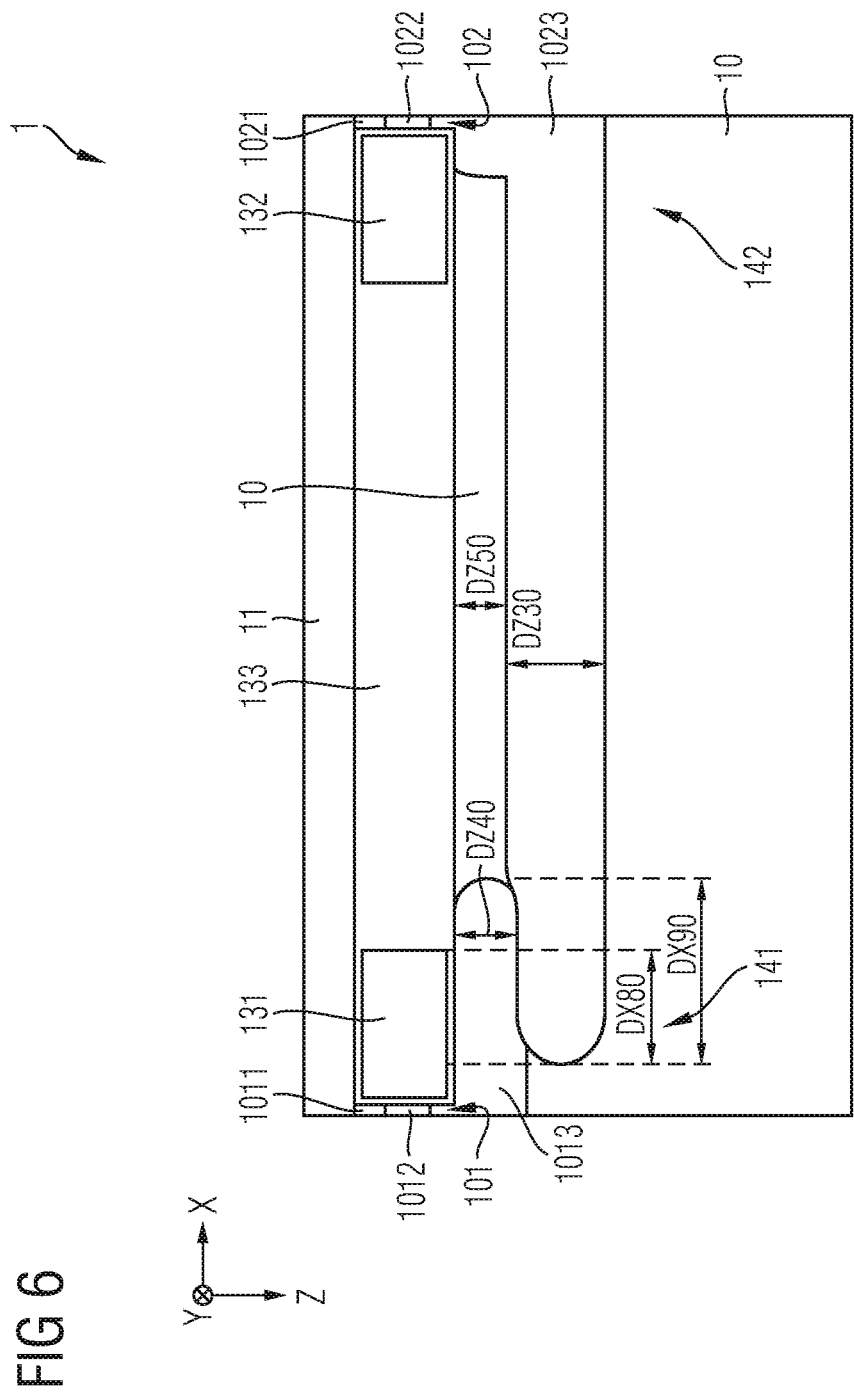

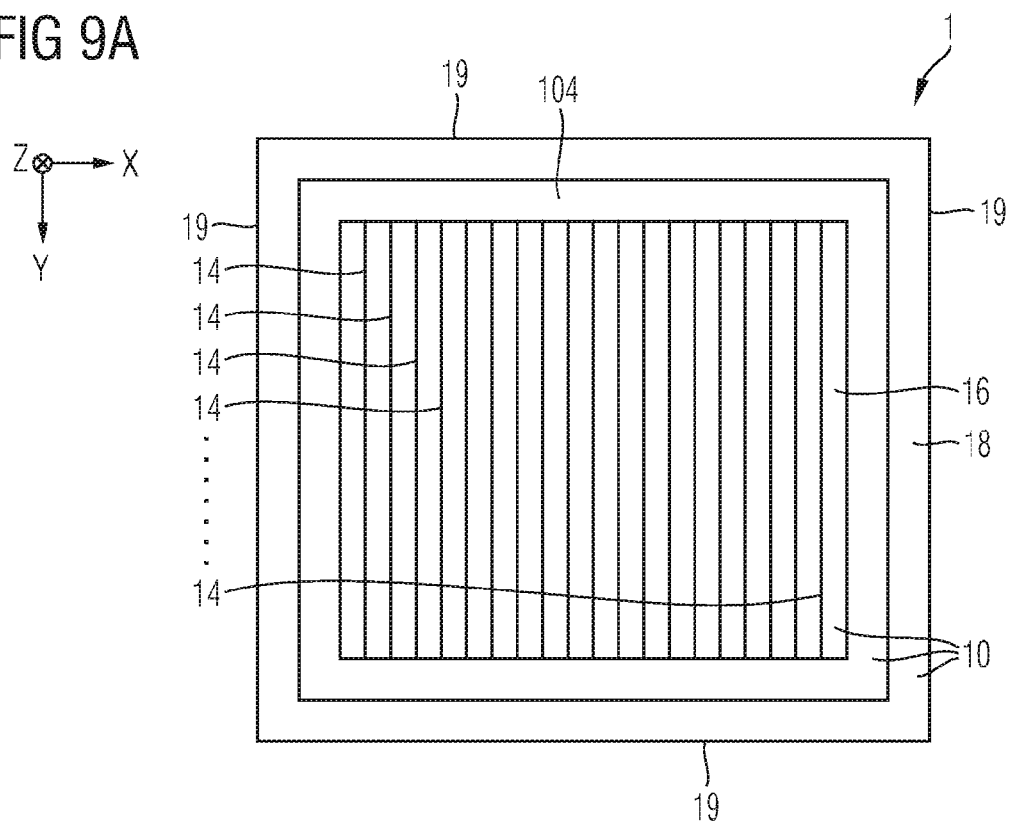
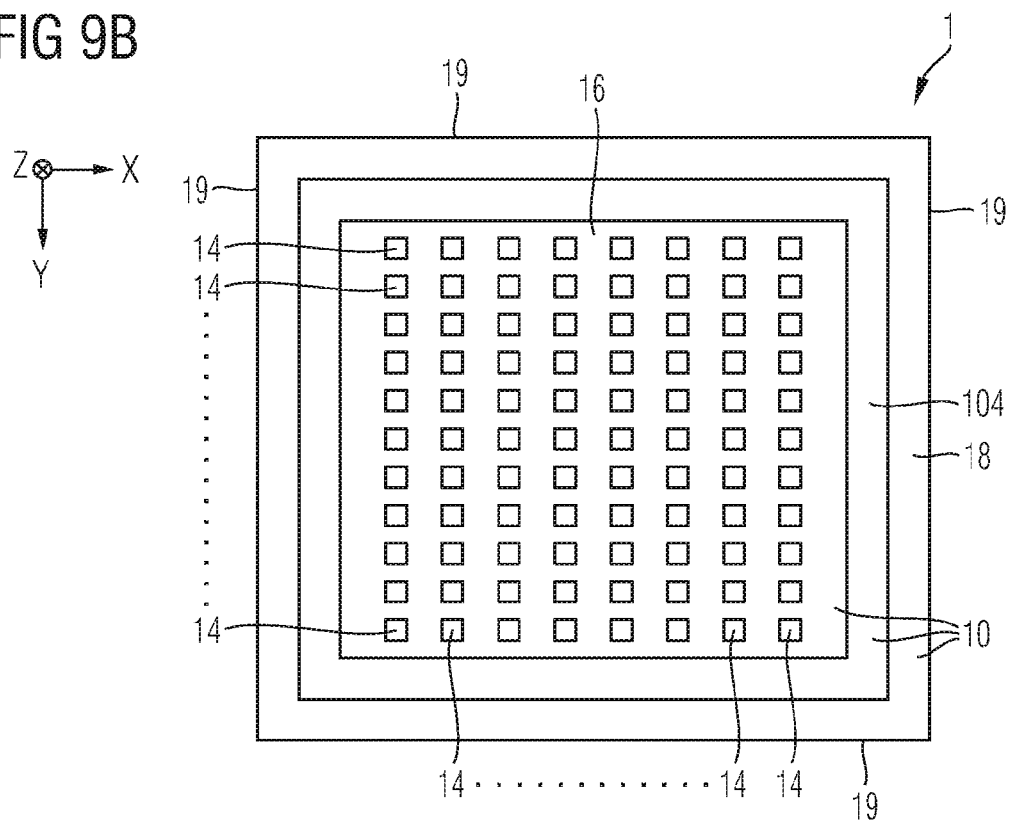

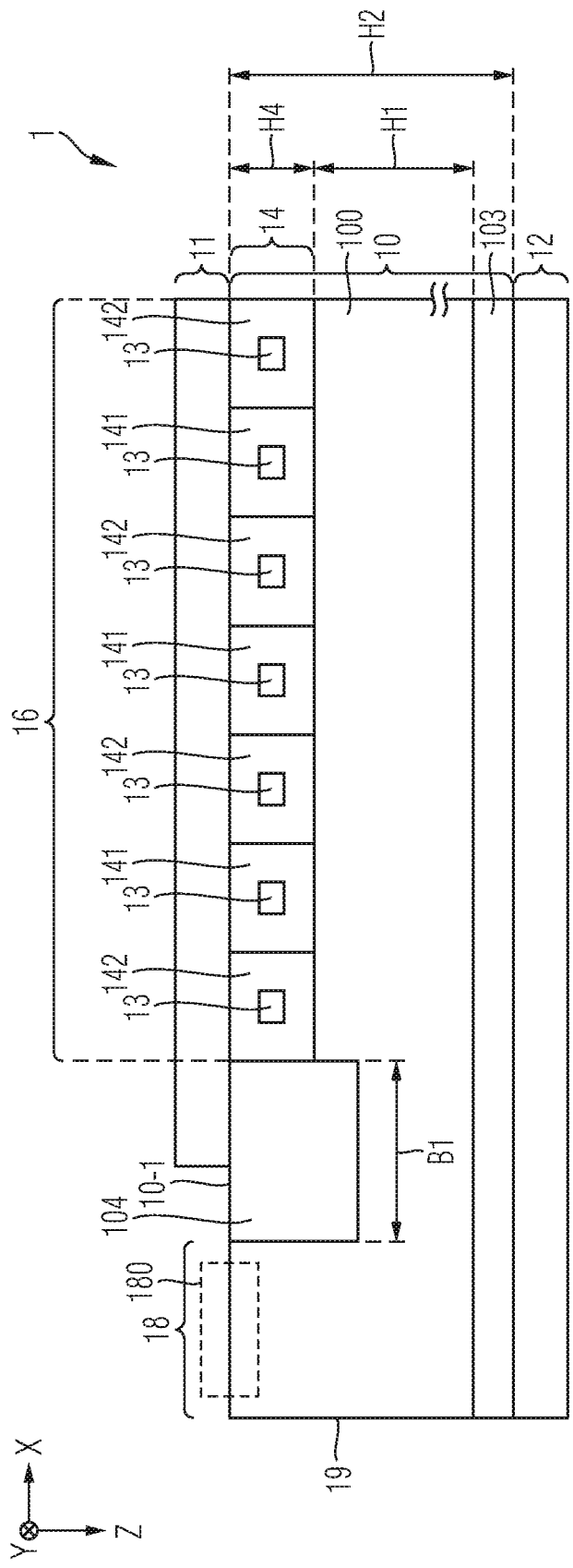

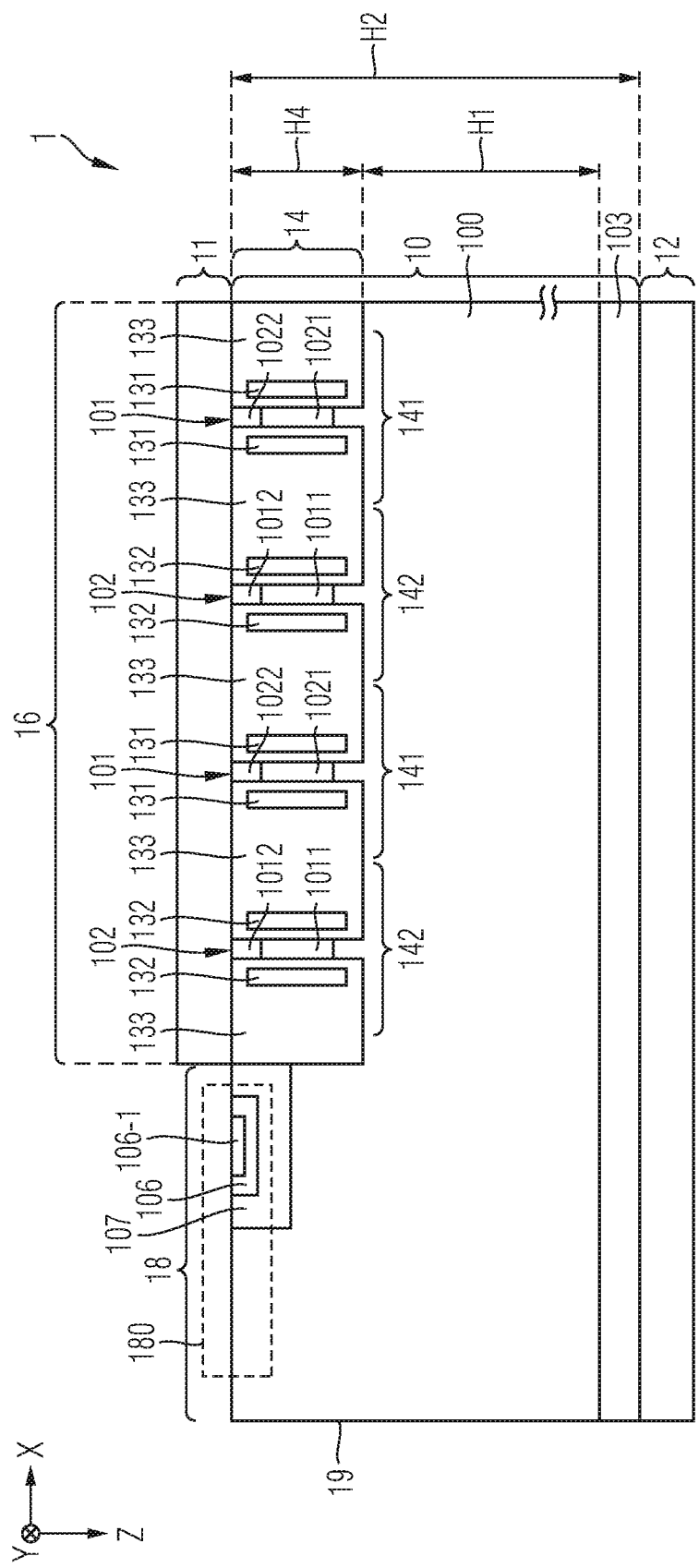

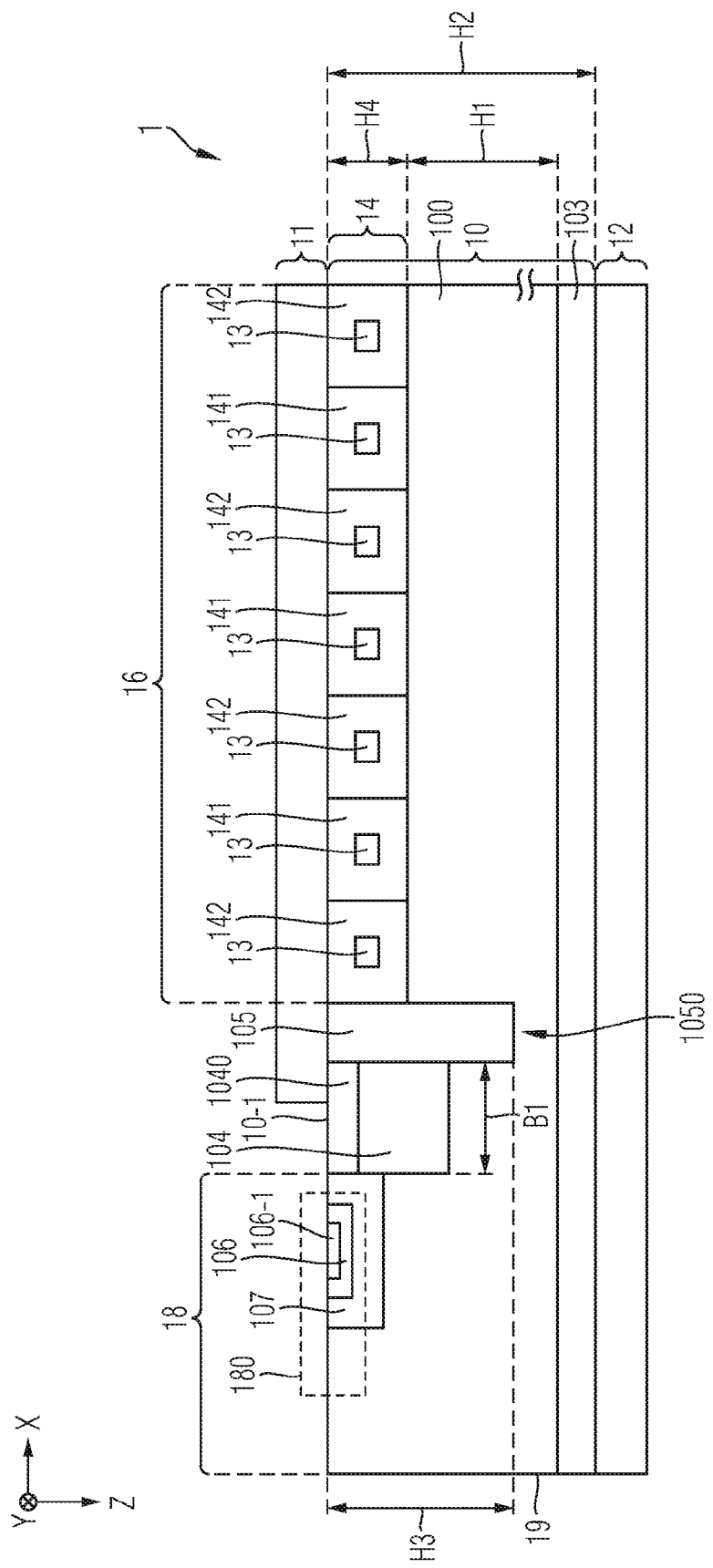

POWER SEMICONDUCTOR DEVICE HAVING FULLY DEPLETED CHANNEL REGIONS

CROSS-REFERENCE TO RELATED APPLICATION

This Utility Patent Application claims priority to German Patent Application No. 10 2016 112 018.9, filed Jun. 30, 2016, which is incorporated herein by reference.

TECHNICAL FIELD

This specification refers to embodiments of a power semiconductor device. In particular, this specification refers to embodiments of a power semiconductor device having an active cell field surrounded by a drainage region and/or by a recombination region.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

It is a general aim to keep losses occurring at semiconductor devices low, wherein said losses essentially are caused by conducting losses and/or switching losses.

For example, a power semiconductor device comprises a plurality of MOS control heads, wherein each control head may have at least one control electrode and a source region and a channel region arranged adjacent thereto.

For setting the power semiconductor device into a conducting state, during which a load current in a forward direction may be conducted, the control electrode may be provided with a control signal having a voltage within a first range so as to induce a load current path within the channel region.

For setting the power semiconductor device into a blocking state, during which a forward voltage applied to load terminals of the semiconductor device may be blocked and flow of the load current in the forward direction is inhibited, the control electrode may be provided with the control signal having a voltage within a second range different from the first range so as to cut off the load current path in the channel region. Then, the forward voltage may induce a depletion region at a junction formed by a transition between the channel region and a drift region of the power semiconductor device, wherein the depletion region is also called "space charge region" and may mainly expand into the drift region of the semiconductor device. In this context, the channel region is frequently also referred to as a "body region", in which said load current path, e.g., an inversion channel, may be induced by the control signal to set the semiconductor device in the conducting state. Without the load current path in the channel region, the channel region may form a blocking junction with the drift region.

In order to prevent a failure of the power semiconductor device, for example during switch-off, it may be desirable to prevent an occurrence of an excessive current density in the vicinity of an edge termination zone of the power semiconductor device.

SUMMARY

According to an embodiment, a power semiconductor device comprises: a semiconductor body coupled to the first load terminal structure and the second load terminal structure; an active cell field implemented in the semiconductor body and configured to conduct a load current, the active cell field being surrounded by an edge termination zone; a plurality of first cells and the plurality of second cells provided in the active cell field, each being configured for controlling the load current and each being electrically connected to the first load terminal structure on the one side and electrically connected to a drift region of the semiconductor body on the other side, the drift region having the first conductivity type. Each first cell comprises the first mesa, the first mesa including: a first port region having the first conductivity type and being electrically connected with the first load terminal structure, and a first channel region being coupled to the drift region. Each second cell comprises the second mesa, the second mesa including: a second port region having the second conductivity type and being electrically connected with the first load terminal structure, and a second channel region being coupled to the drift region. Each first mesa and each second mesa are spatially confined, in a direction perpendicular to the direction of the load current within the respective mesa, by an insulation structure and exhibit a total extension of less than 100 nm in said direction. The active cell field is surrounded by a drainage region which is arranged between the active cell field and the edge termination zone, the drainage region having the second conductivity type and being electrically connected to the first load terminal structure.

According to a further embodiment, a further power semiconductor device comprises: the semiconductor body coupled to the first load terminal structure and the second load terminal structure; an active cell field implemented in the semiconductor body and configured to conduct a load current, the active cell field being surrounded by an edge termination zone; a plurality of first cells and the plurality of second cells provided in the active cell field, each being configured for controlling the load current and each being electrically connected to the first load terminal structure on the one side and electrically connected to the drift region of the semiconductor body on the other side, the drift region comprising the first conductivity type. Each first cell comprises a first mesa, the first mesa including: a first port region having the first conductivity type and being electrically connected with the first load terminal structure, and a first channel region being coupled to the drift region. Each second cell comprises a second mesa, the second mesa including: a second port region having the second conductivity type and being electrically connected with the first load terminal structure, and a second channel region being coupled to the drift region. Each first mesa and each second mesa are spatially confined, in a direction perpendicular to the direction of the load current within the respective mesa, by an insulation structure and exhibit a total extension of less than 100 nm in said direction. The active cell field is surrounded by a recombination region which is arranged between the active cell field and at least one lateral edge of the semiconductor body, wherein a charge carrier lifetime inside the recombination region is less than a charge carrier lifetime inside the drift region by a factor of at least 50.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 6 schematically illustrates a section of a vertical cross-section of a power semiconductor device in accordance with one or more embodiments;

FIGS. 9A-D each schematically illustrate a section of a horizontal projection of a power semiconductor device in accordance with one or more embodiments;

FIGS. 10A-B each schematically illustrates a section of a vertical cross-section of a power semiconductor device in accordance with one or more embodiments;

FIGS. 13A-B each schematically illustrate a section of a vertical cross-section of a power semiconductor device in accordance with one or more embodiments;

FIG. 14 schematically illustrates a section of a vertical cross-section of a power semiconductor device in accordance with one or more embodiments.

DETAILED DESCRIPTION

Figure 1A:
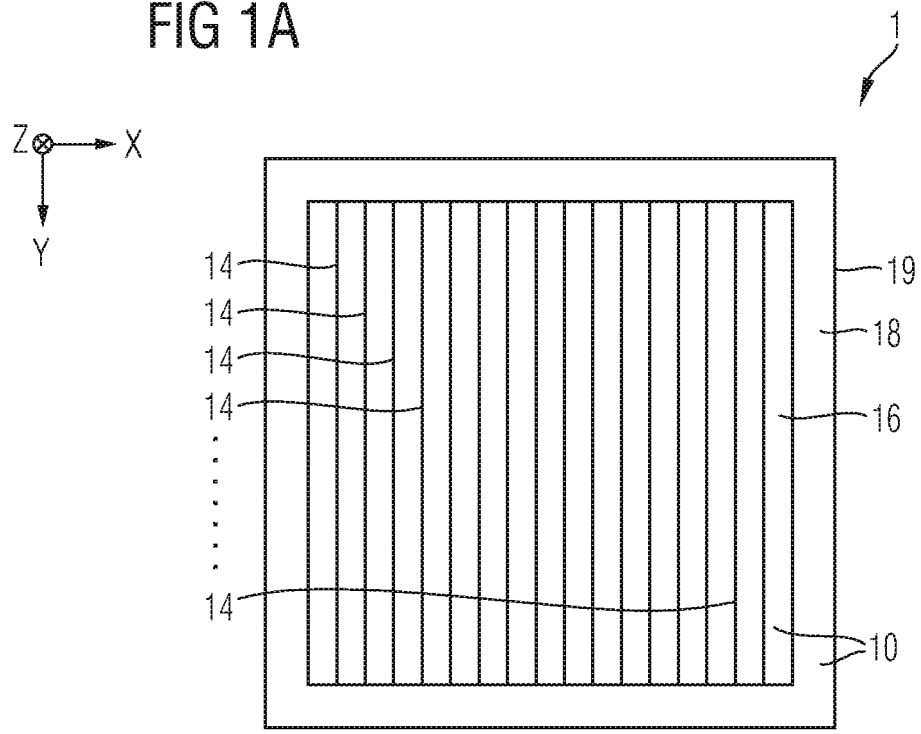
FIGS. 1A-B each schematically illustrate sections of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification may describe an orientation substantially parallel to a horizontal surface of a semiconductor substrate or of a semiconductor region, such as the semiconductor body mentioned below. This can be for instance the surface of a semiconductor wafer or a die. For example, both the first lateral direction X and the second lateral direction Y mentioned below may be horizontal directions, wherein the first lateral direction X and the second lateral direction Y may be perpendicular to each other.

The term "vertical" as used in this specification may describe an orientation which is substantially arranged perpendicular to the horizontal surface, i.e., parallel to the normal direction of the surface of the semiconductor wafer. For example, the extension direction Z mentioned below may be a vertical direction Z is perpendicular to both the first lateral direction X and the second lateral direction Y.

However, it shall be understood that the embodiments of power semiconductor devices described below may exhibit a lateral configuration or a vertical configuration. In the first case, the extension direction Z may in fact be a lateral direction and not a vertical direction, and at least one of the first lateral direction X and the second lateral direction Y may in fact be a vertical direction.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

The term "power semiconductor device" as used in this specification intends to describe a semiconductor device on a single chip with high voltage blocking and/or high current-carrying capabilities. In other words, such power semiconductor device is configured for a high load current, typically in the Ampere range, e.g., up to several ten or hundred Ampere, and/or high voltages, typically above 5 V, or above 15 V or more typically 400V and, e.g., up to some 1000 Volts.

For example, the term "power semiconductor device" as used in this specification is not directed to logic semiconductor devices that are used for, e.g., storing data, computing data and/or other types of semiconductor based data processing.

Specific embodiments described in this specification thus pertain to, without being limited thereto, a power semiconductor device (in the following simply also referred to as "semiconductor device" or "device") that may be used within a power converter or a power supply, e.g., for converting a first power signal into a second power signal different from the first power signal. For example, to this end, the power semiconductor device may comprise one or more power semiconductor cells, such as a monolithically integrated transistor cell, a monolithically integrated diode cell, and/or a monolithically integrated IGBT cell, and/or a monolithically integrated MOS Gated Diode (MGD) cell, and/or a monolithically integrated MOSFET cell and/or derivatives thereof. Such diode cells and/or such transistor cells may be integrated in a semiconductor chip, wherein a number of such chips may be integrated in a power semiconductor module, such as an IGBT module.

Figure 1B:
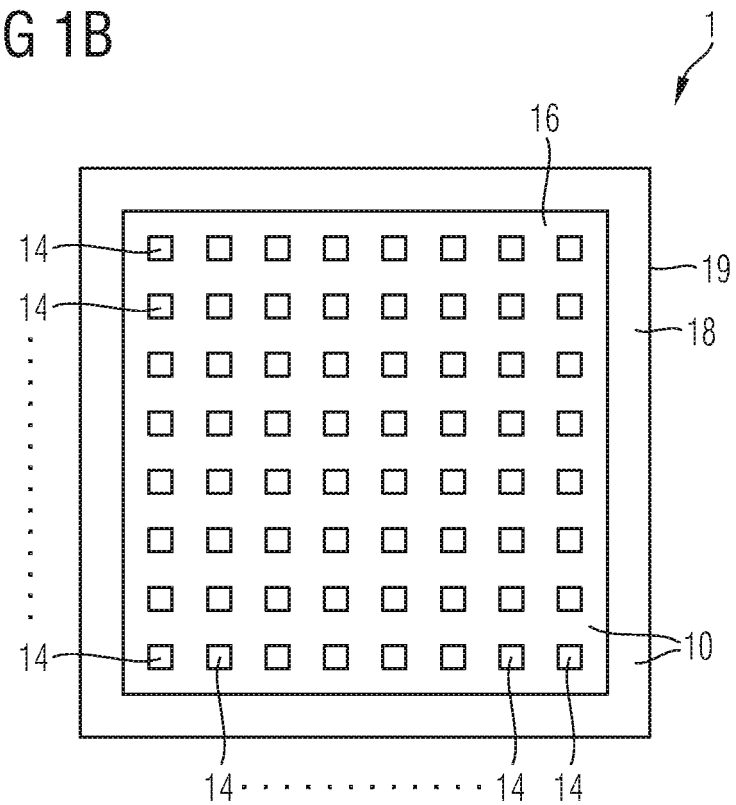

FIG. 1A schematically and exemplarily illustrates a section of a horizontal projection of a power semiconductor device 1 in accordance with one or more embodiments. Also FIG. 1B schematically and exemplarily illustrates a section of a horizontal projection of a power semiconductor device 1 in accordance with one or more other embodiments. In both of FIG. 1A and FIG. 1B, the horizontal projection may be in parallel to the plane defined by the first lateral direction X and the second lateral direction Y. The components of the semiconductor device 1 may each extend along the extension direction Z that may be perpendicular to each of the first lateral direction X and the second lateral direction Y.

The semiconductor device 1 may comprise an active cell field 16 that includes one or more active cells 14, e.g., MOS (Metal Oxide Semiconductor) cells, in the following simply referred to as "cells" 14. The number of cells 14 may be within the range of 100 to 100000, for example. The active cell field 16 may be configured to conduct a total load current, wherein the total load current may be greater than 1 A, greater than 10 A or even greater than 100 A. In the following, said total toad current is also simply referred to as "load current".

The active cell field 16 may be surrounded by an edge termination zone 18 of the semiconductor device 1. For example, the edge termination zone 18 does not include any active cells. The edge termination zone 18 may be terminated by an edge 19, which may have come into being, e.g., by dicing a chip out of a wafer.

Further, the active cell field 16 or, respectively, the active cell field 16 and the edge termination zone 18 may be configured to block a voltage of at least 20 V, of at least 100 V, of at least 400 V or of at least 1000 V.

As schematically illustrated in FIG. 1A, the cells 14 may exhibit a stripe configuration. Accordingly, each of the cells 14 and the components they may comprise may extend along substantially the entire active cell field 16 along one of the first lateral direction X and the second lateral direction Y (as illustrated), e.g., bordering a transition region between the active cell field 16 and the edge termination zone 18. For example, the total lateral extension of a respective (stripe) cell amounts to less than 30%, less than 5%, or even less than 1% of the total extension of the active cell field 16 along one of the first lateral direction X and the second lateral direction Y.

In another embodiment that is schematically illustrated in FIG. 1B, the cells 14 may exhibit a needle configuration whose total lateral extensions along each of the first lateral direction X and the second lateral direction Y amount to only a fraction of the total lateral extensions along the first lateral direction X and the second lateral direction Y of the active cell field 16. For example, the total lateral extension of a respective needle cell amounts to less than 30%, less than 5%, or even less than 1% of the total extension of the active cell field 16 along one of the first lateral direction X and the second lateral direction Y. Further optional aspects of a needle cell and a stripe cell will be explained further below.

In another embodiment, the active cell field 16 may comprise both types of cells 14, e.g., one or more cells 14 in a stripe configuration and one or more cells 14 in a needle configuration.

Both the active cell field 16 and the edge termination zone 18 may at least partially be formed within a joint semiconductor body 10 of the device 1. The semiconductor body 10 may be configured to carry the total load current that may be controlled, e.g., by means of the cells 14, as will be explained in more detail below.

In an embodiment, the semiconductor device 1 is a bipolar power semiconductor device 1. Thus, the total load current within the semiconductor body 10 may be constituted by a first load current formed by first charge carriers of a first conductivity type and by a second load current formed by second charge carriers of a second conductivity type complimentary to the first conductivity type. For example, the first charge carriers are electrons and the second charge carriers are holes.

Figure 2A:
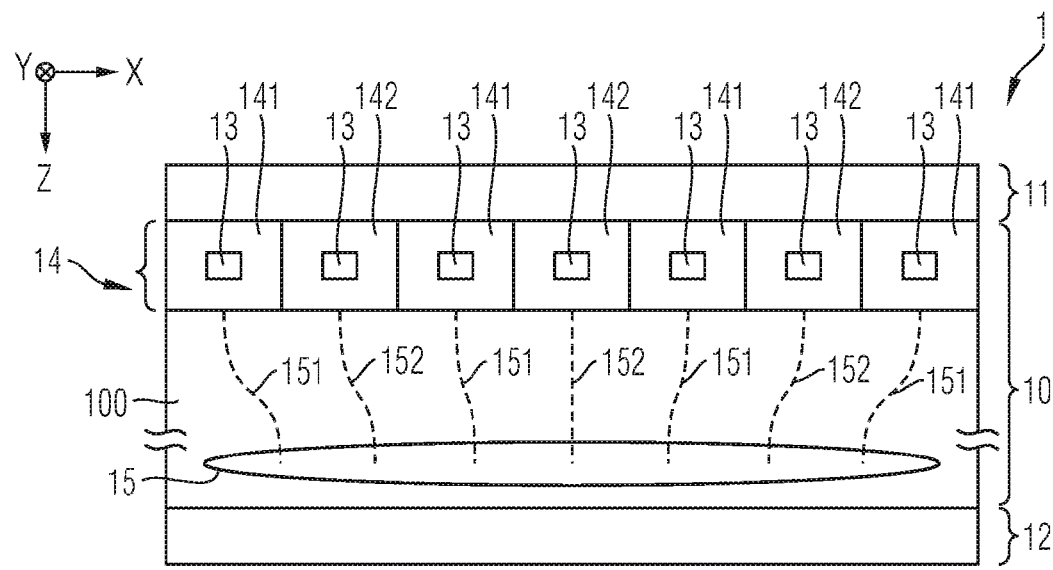
FIGS. 2A-B each schematically illustrate a section of a vertical cross-section of a power semiconductor device in accordance with one or more embodiments.

Regarding now FIG. 2A, which schematically and exemplarily illustrates a section of a vertical cross-section of the semiconductor device 1 in accordance with one or more embodiments, the semiconductor device 1 may further comprise a first load terminal structure 11 and a second load terminal structure 12. For example, the first load terminal structure 11 is arranged separately from the second load terminal structure 12. The semiconductor body 10 may be coupled to each of the first load terminal structure 11 and the second load terminal structure 12 and may be configured to receive the total load current 15 (also referred to as "load current") via the first load terminal structure 11 and to output the total load current 15 via the second load terminal structure 12 and/or vice versa.

The semiconductor device 1 may exhibit a vertical set-up, according to which, for example, the first load terminal structure 11 is arranged on a frontside of the semiconductor device 1 and the second load terminal structure 12 is arranged on a backside of the semiconductor device 1. In another embodiment, the semiconductor device 1 may exhibit a lateral set-up, according to which, e.g., each of the first load terminal structure 11 and the second load terminal structure 12 are arranged on the same side of the semiconductor device 1.

For example, the first load terminal structure 11 comprises a first metallization, e.g., a frontside metallization, and the second load terminal structure 12 may comprise a second metallization, e.g., a backside metallization. Further, one or both of the first load terminal structure 11 and the second load terminal structure 12 may comprise a diffusion barrier.

Within the present specification, the direction of the total load current 15 is expressed in the conventional manner, i.e. as a flow direction of positive charge carriers such as holes and/or as direction opposite to a flow of negative charge carriers such as electrons. A forward direction of the total load current 15 may point, for example, from the second load terminal structure 12 to the first load terminal structure 11.

As has been explained above, the total load current 15 may comprise a first load current 151 of the first conductivity type, e.g., an electron current, and a second load current 152 of the second conductivity type, e.g., a hole current. Thus, the direction of the second load current 152 may be in parallel to the technical (conventional) direction of the total load current 15, whereas the direction of the first load current 151 may be in anti-parallel to the direction of the load current 15. The sum of amounts of the first load current 151 and the second load current 152 may form the total load current 15 conducted by the semiconductor body 10.

Figure 2B:
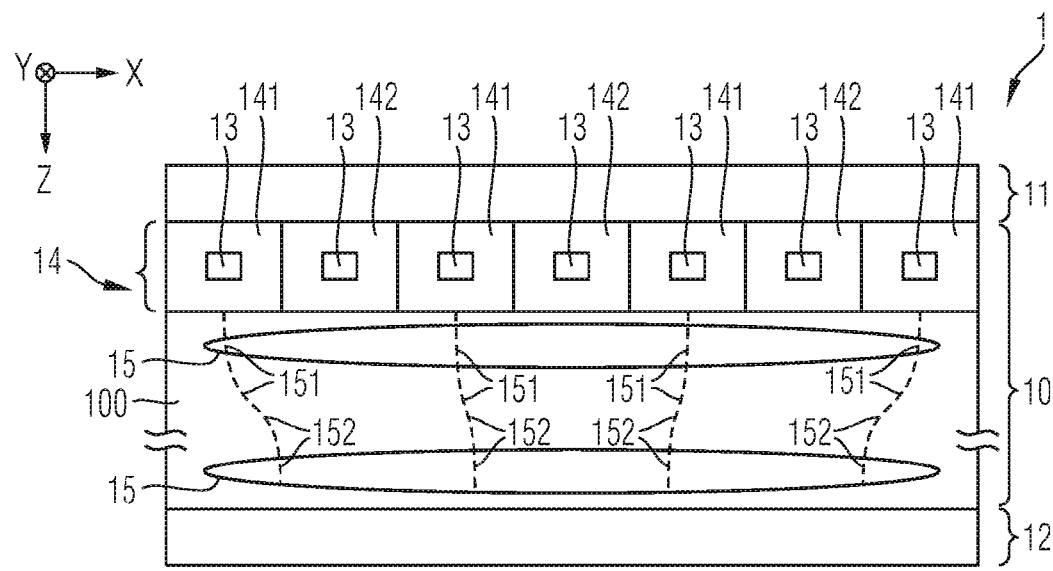

A first charge carrier of the first conductivity type, e.g., an electron, moving from the first load terminal structure 11 towards the second load terminal structure 12 or vice versa may recombine with a second charge carrier of the complementary type, e.g., of the second conductivity type, e.g., a hole, on its way through the semiconductor body 10. For example, as illustrated in FIGS. 2B and 3B, in the vicinity of the first load terminal structure 11, the total load current 15 in the forward direction may largely or even entirely consist of the first load current 151 of electrons moving towards the second load terminal structure 12, wherein, in the vicinity of the second load terminal structure 12, the total load current 15 in the forward direction may mostly or even entirely consist of a second load current 152 of holes moving towards the first load terminal structure 11. The electrons and holes may recombine inside the semiconductor body 10. However, within a drift region 100 of the semiconductor body 10, there occurs substantially no or only little recombination, according to one or more embodiments. According to an embodiment, an ambipolar lifetime of the first and second charge carrier type, i. e., the time until the density of carriers is reduced to a value of $1/e \approx 37\%$ of their initial value, is more than e. g., 1 μs, more than 10 μs, more than 30 μs or more than 70 μs.

Further, the first load current 151 may be made up of a first drift current, e.g., an electron drift current, and a first diffusion current, e.g., an electron diffusion current. Also, the second load current 152 may be made up of a second drift current, e.g., a hole drift current, and second diffusion current, e.g., a hole diffusion current.

Thus, in the conducting state of the semiconductor device 1, the total load current 15 can be conducted by the semiconductor body 10, wherein at each cross-section through the semiconductor body 10 separating the first load contact structure 11 from the second load contact structure 12, the total load current 15 can be composed of the first load current 151 flowing through said cross-section, which may be an electron current, and the second load current 152 flowing through said cross-section, which may be a hole current. At each cross-section, the sum of amounts of the first load current 151 and the second load current 152 may equal the amount of the total load current 15, wherein said cross-sections may be perpendicular to the direction of the total load current 15. For example, during the conducting state, the total load current 15 may be dominated by the first load current 151, i.e., the first load current 151 may be substantially greater than the second load current 152, e.g., amounting to more than 75%, more than 80%, or even more than 90% of the total load current 15. During a transition from the blocking state to the conducting state or during a transition from the conducting state to the blocking state, i.e., during switching, the second load current 152 may represent a higher portion of the total load current 15, i.e., the second load current 152 may be even greater than the first load current 151.

For controlling the total load current 15, the semiconductor device 1 may further comprise a control terminal structure 13. For example, the semiconductor device 1 may be configured to be set into one of the blocking state and the conducting state by means of the control terminal structure 13.

In an embodiment, for setting the semiconductor device 1 into a conducting state during which the total load current 15 in the forward direction may be conducted, the control terminal structure 13 may be provided with a control signal having a voltage within a first range. For setting the semiconductor device 1 into a blocking state during which a forward voltage may be blocked and flow of the load current 15 in the forward direction is avoided, the control terminal structure 13 may be provided with the control signal having a voltage within a second range different from the first range.

In an embodiment, the control signal may be provided by applying a voltage between the control terminal structure 13 and the first load terminal structure 11 and/or by applying a voltage between the control terminal structure 13 and the second load terminal structure 12.

For example, the control terminal structure 13 may at least partially be implemented within the cells 14, as schematically illustrated in FIGS. 2A-3B. Further, the cells 14 may at least partially be implemented within the semiconductor body 10. In other words, the cells 14 may form a part of the semiconductor body 10.

In an embodiment, the cells 14 may comprise at least one first cell 141 and at least one second cell 142. The second cell 142 may be different and arranged separately from the first cell 141.

Each of the first cell 141 and the second cell 142 may be electrically connected to the first load terminal structure 11 on one side and to the semiconductor drift region 100 (herein also simply referred to as "drift region") of the semiconductor body 10 on another side. Thus, in an embodiment, each of the first cell 141 and the second cell 142 may form an interface between the drift region 100 of the semiconductor body 10 on the one side and the first load terminal structure 11 on the other side. Further, in regions of the semiconductor device 1 where there are no cells 14, e.g., in said edge termination zone 18, the semiconductor body 10, e.g., the drift region 100, may be electrically insulated from the first load terminal structure 11.

The drift region 100 may have the first conductivity type. For example, the drift region 100 exhibits a concentration of dopants of the first and/or of the second conductivity type within the range of $10^{12}$ cm$^{-3}$ to $10^{18}$ cm$^{-3}$, e.g., $10^{13}$ cm$^{-3}$ to $10^{15}$ cm$^{-3}$, e.g., within in the range of $2*10^{13}$ cm$^{-3}$ to $2*10^{14}$ cm$^{-3}$. For example, the comparatively high dopant concentrations may be applicable if the semiconductor device 1 exhibits a compensation structure (also referred to as superjunction structure). In this case, locally high concentrations of dopants of the first and the second conductivity type may occur. However, when integrating the first and second doping concentrations in the drift region 100 in a plane, the resulting integrated dopant concentration can be significantly lower, at least e. g., by a factor of 3, or a factor of 5, or a factor of 10 than the larger of the individual dopant concentration of the first and/or second conductivity type. Such locally high dopant concentration may be supportive for draining charge carriers out of the semiconductor body 10, e.g., during turn-off, and may thus lead to reduced turn-off losses and/or faster turn-off.

In an embodiment, the first cell 141 is configured to control the first load current 151 and the second cell 142 is configured to control the second load current 152. For example, the first cell 141 is configured to prevent the second load current 152 from traversing the first cell 141. Further, the second cell 142 can also be configured to prevent the second load current 152 from traversing the second cell 142, e.g., if the semiconductor device 1 is in a conducting state.

The first cell 141 may thus be a unipolar cell configured to control charge carriers of the first conductivity type and the second cell 142 may be a unipolar cell configured to control charge carriers of the second conductivity type.

In an embodiment, the semiconductor device 1 may be configured to split the total load current 15 conducted by the semiconductor body 10 into the first load current 151 and into the second load current 152 by means of the first cell 141 and the second cell 142 that may form an interface between the first load terminal structure 11 and a part of the semiconductor body 10, e.g., said drift region 100. Thus, in the path of the total load current 15 between the drift region 100 of the semiconductor body 10 and the first load terminal structure 11, the first load current 151 may traverse the first cell 141, e.g., if the semiconductor device 1 is in a conducting state, and, e.g., if the semiconductor device 1 is switched from the conducting state to the blocking state, the second load current 152 may traverse the second cell 142, as will be explained in more detail below.

Figure 3A:
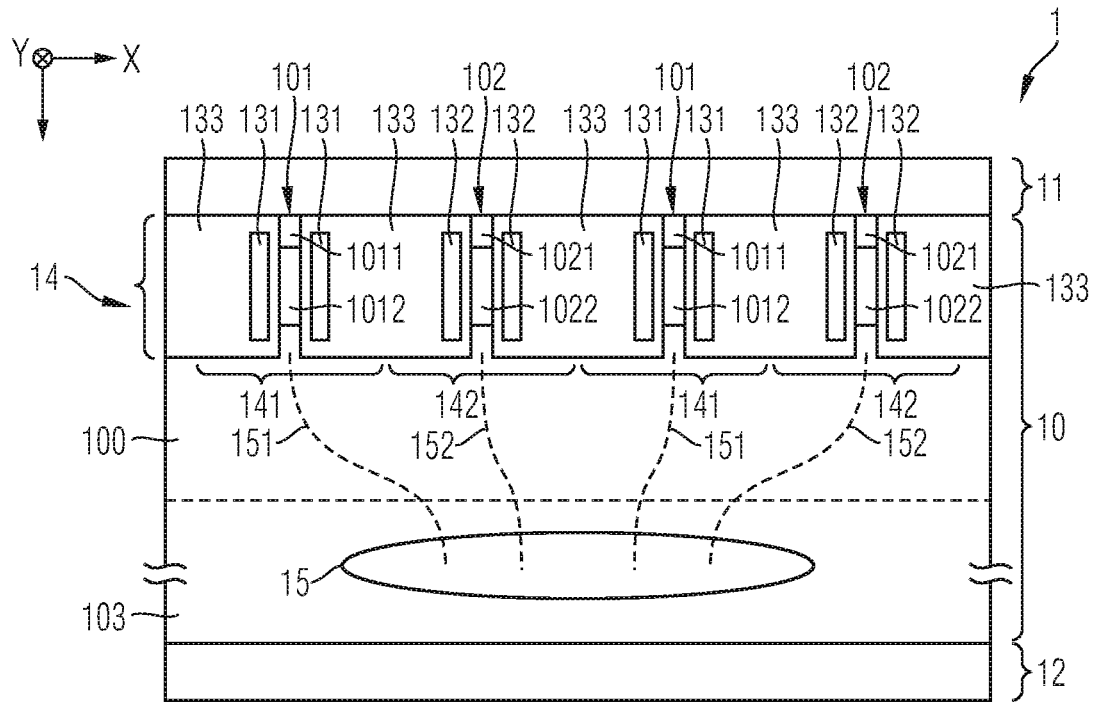
FIGS. 3A-B each schematically illustrate a section of a vertical cross-section of a power semiconductor device in accordance with one or more embodiments.
Figure 3B:
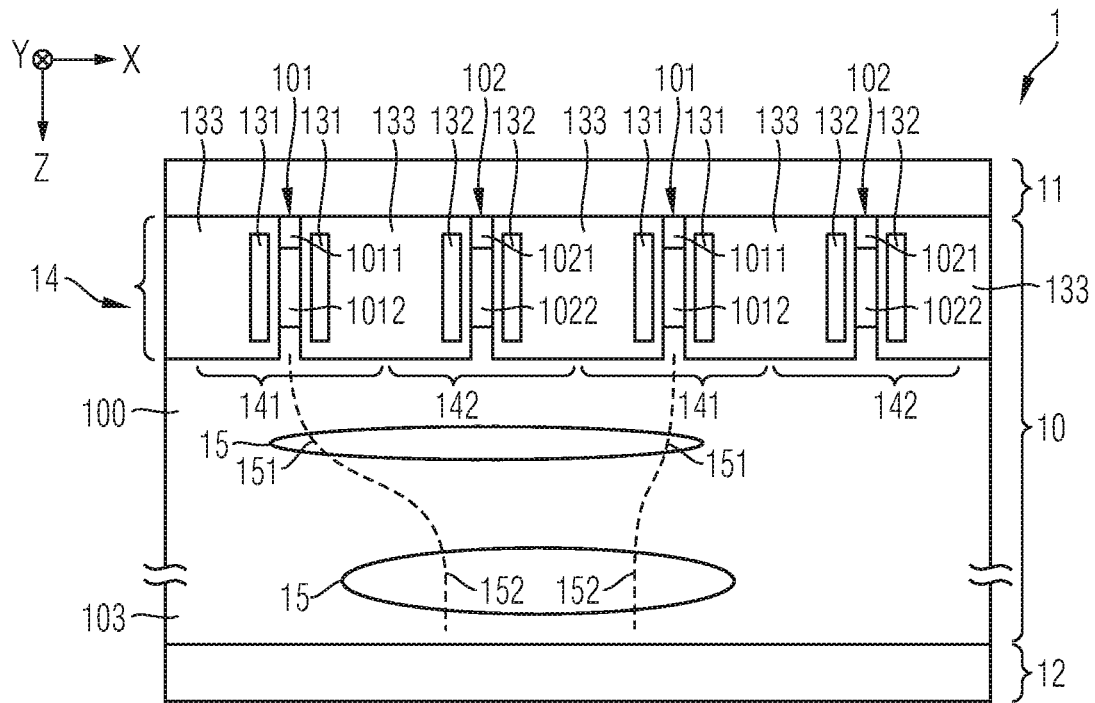

With respect to FIGS. 3A and 3B, exemplary aspects of the cells 14 shall be explained.

FIGS. 3A and 3B schematically and exemplarily illustrate sections of a vertical cross-section of the semiconductor device 1 in accordance with one or more embodiments. The general configuration of the semiconductor device 1 in accordance with the embodiment of FIGS. 3A-B may be identical or similar to the general configuration of the semiconductor device 1 in accordance with the embodiments of FIGS. 1A, 1B and 2A, 2B. Thus, what has been stated above with respect to FIGS. 1A to 2B may equally apply to the embodiment of FIGS. 3A and 3B, if not stated otherwise.

In an embodiment, the control signal provided to the control terminal structure 13 comprises a first control signal and a second control signal. The first control signal may be provided for controlling the first cell 141 and the second control signal may be provided for controlling the second cell 142. In an embodiment, the first control signal is identical to the second control signal. In another embodiment, the first control signal is different from second control signal. The control signal may be provided from external of the semiconductor device 1, e.g., by a driver (not illustrated) configured to generate the first control signal and the second control signal. In another embodiment, one or both of the first control signal and second control signal may be generated or provided by an internal signal or by an internal potential of the semiconductor device 1.

Further, the control terminal structure 13 may comprise one or more first control electrodes 131 and/or one or more second control electrodes 132.

The first cell 141 may comprise one or more of the first control electrodes 131 that can be configured to receive the first control signal. The first control electrodes 131 may be insulated from the semiconductor body 10 by means of an insulation structure 133.

The second cell 142 may comprise one or more of the second control electrodes 132 that can be configured to receive the second control signal. The second control electrodes 132 may also be insulated from the semiconductor body 10 by means of the insulation structure 133.

The material and the dimensions of the one or more first control electrodes 131 may be identical to the material and the dimensions of the one or more second control electrodes 132 or different therefrom.

Further, already at this point, it shall be understood that in contrast to the exemplary schematic representations in FIGS. 3A, 3B, 5A and 6, the control electrodes 131 and 132 may also be arranged in contact with each other in accordance with one or more embodiments, thereby forming a monolithic control electrode used for controlling each of the first cell 141 and the second cell 142. In other words, in an embodiment, the control electrodes 131 and 132 can be respective sections of one joint control electrode.

The insulation structure 133 may thus house each of the first control electrode(s) 131 and the second control electrode(s) 132. Further, one, more or each of the first control electrode(s) 131 and the second control electrode(s) 132 may be electrically insulated from the first load terminal structure 11.

In an embodiment, the first cell 141 includes a first mesa 101 at least partially implemented as a part of the semiconductor body 10. Also, the second cell 142 may include a second mesa 102 that is at least partially implemented as a part of the semiconductor body 10. For example, each of the first mesa 101 and the second mesa 102 is electrically connected to the first load terminal structure 11. The second mesa 102 can be different and arranged separately from the first mesa 101.

The first mesa 101 and the second mesa 102 may be spatially confined by the insulation structure 133. Exemplary specifications of the spatial dimensions of the mesa 101 and 102 and their components will be disclosed with respect to FIG. 5. At the same time, the insulation structure 133 may house the first control electrode(s) 131 and the second control electrode(s) 132.

The first mesa 101 may include a first port region 1011 electrically connected to the first load terminal structure 11. The first port region 1011 may be a first semiconductor port region. For example, the first port region 1011 has the first conductivity type, e.g., at a dopant concentration in the range of $10^{19}$ cm$^{-3}$ to $10^{22}$ cm$^{-3}$, e.g., $10^{20}$ cm$^{-3}$ to $5*10^{21}$ cm$^{-3}$. For example, the first port region 1011 is an n$^+$-region. Thus, a dopant concentration of the first port region 1011 may be at least two orders of magnitude (corresponding to a factor of 100) greater than the dopant concentration of the drift region 100. In an embodiment, the first port region 1011 is a doped semiconductor region that has additionally been silicided. For example, a silicide is provided in the first port region 1011. Further, such silicided first port region 1011 may exhibit a common extension range along the extension direction Z with the first control electrode 131. For example, such silicided first port region 1011 could also be referred to as "metal source". At a transition from the silicided first port region 1011 to a first channel region 1012 (explained in more detail below) of the first mesa 101, a doping spike may be present, e.g., an $n^+$-doping spike.

Also, the second mesa 102 may include a second port region 1021 electrically connected to the first load terminal structure 11. The second port region 1021 may be a second semiconductor port region. For example, the second port region 1021 has the second conductivity type, e.g., at a dopant concentration in the range of $10^{18}$ cm$^{-3}$ to $10^{22}$ cm$^{-3}$, e.g., $10^{19}$ cm$^{-3}$ to $10^{21}$ cm$^{-3}$. For example, the second port region 1021 is a $p^+$-region. Thus, a dopant concentration of the second port region 1021 may be at least two orders of magnitude greater than the dopant concentration of the drift region 100. In an embodiment, the second port region 1021 is a doped semiconductor region that has additionally been silicided. For example, a silicide is provided in the second port region 1021. Further, such silicided second port region 1021 may exhibit a common extension range along the extension direction Z with the second control electrode 132. At a transition from the silicided second port region 1021 to a second channel region 1022 (explained in more detail below) of the second mesa 102, a doping spike may be present, e.g., a $p^+$-doping spike.

The first mesa 101 may further include a first channel region 1012 in contact with the first port region 1011. The first channel region 1012 may be a first semiconductor channel region. For example, the first channel region 1012 has the second conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$. For example, the first channel region 1012 is a $p^-$-region or a $p^-$-region. In another embodiment, the first channel region 1012 has the first conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$.

For example, the first channel region 1012 may further be coupled to the semiconductor drift region 100, e.g., it may be in contact with the drift region 100 or may be coupled thereto by means of a plateau region (not illustrated in FIGS. 2A-3B) elucidated in more detail below.

In an embodiment, the first channel region 1012 may isolate the first port region 1011 from the semiconductor drift region 100. Further, the first channel region 1012 may be an electrically floating region. For example, the first channel region 1012 is not in contact with the first load terminal structure 11 but separated therefrom by means of the first port region 1011.

The second mesa 102 may further include a second channel region 1022 in contact with the second port region 1021. The second channel region 1022 may be a second semiconductor channel region. For example, the second channel region 1022 has the second conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$. For example, the second channel region 1022 is a p-region. In another embodiment, the second channel region 1022 has the first conductivity type, e.g., at a dopant concentration in the range of up to $10^{19}$ cm$^{-3}$, e.g., $10^{11}$ cm$^{-3}$ to $10^{18}$ cm$^{-3}$, e.g., in the range of $10^{14}$ cm$^{-3}$ to $10^{18}$ cm$^{-3}$.

For example, the second channel region 1022 may further be coupled to the semiconductor drift region 100, e.g., it may be in contact with the drift region 100 or may be coupled thereto by means of another plateau region (not illustrated in FIGS. 2A-3B) elucidated in more detail below.

Further, the second channel region 1022 may isolate the second port region 1021 from the semiconductor drift region 100. Further, the second channel region 1022 may be an electrically floating region. For example, the second channel region 1022 is not in contact with the first load terminal structure 11 but separated therefrom by means of the second port region 1021. In another example, the second channel region 1022 may be of the same conductivity type as the second port region 1021 and the second channel region 1022 is only temporarily rendered into an insulating or floating state by applying a suitable work function of the material of the second control electrode 132 or a suitable electrical potential to the second control electrode 132.

Thus, in contrast to a conventional IGBT configuration, in an embodiment of the power semiconductor device 1, at least the first channel region 1012 is not electrically connected to the first load terminal structure 11 within the active cell field 16, but electrically floating. For example, the first mesa 101 is coupled to the first load terminal structure exclusively by means of the first port region 1011. Additionally or alternatively, the second channel region 1022 is not electrically connected to the first load terminal structure 11 within the active cell field 16, but electrically floating. For example, the second mesa 102 is coupled to the first load terminal structure exclusively by means of the second port region 1021.

The first mesa 101 can be a first semiconductor mesa and the second mesa 102 can be a second semiconductor mesa. In another embodiment, one or each of the first port region 1011 and the second port region 1022 may comprise a metal.

For example, the first port region 1011 amounts to a certain portion of the total volume of the first mesa 101, e.g., within the range of up to 75%, e.g., 10% to 75%, e.g., in the range of 20% to 50%. The first channel region 1012 may amount to another portion of the total volume of the first mesa 101, e.g., within the range of 10% to 90%, e.g., 25% to 90%, e.g., in the range of 25% to 75%.

The second port region 1021 may amount to a certain portion of the total volume of the second mesa 102, e.g., within the range of up to 75%, e.g., 10% to 75%, e.g., in the range of 20% to 50%. The second channel region 1022 may amount to another portion of the total volume of the second mesa 102, e.g., within the range of 10% to 90%, e.g., 25% to 90%, e.g., in the range of 25% to 75%.

In an embodiment, the first cell 141 including the first mesa 101 is configured to fully deplete the first channel region 1012 of mobile charge carriers of the second conductivity type in the conducting state of the semiconductor device 1.

Further, the second cell 142 including the second mesa 102 may be configured to fully deplete the second channel region 1022 of mobile charge carriers of the second conductivity type in the conducting state of the semiconductor device 1.

In the conducting state, as exemplarily illustrated in FIG. 3B, the semiconductor device 1 may be configured to split the path of total load current 15 into at least two separate paths, the first one of which is taken by the first load current 151 and traversing the first mesa 101 including the first channel region 1012 that is fully depleted of mobile charge carriers of the second conductivity type, and the second one of which is taken by the second load current 152 and does neither traverse the second mesa 102 including the second channel region 1022 that may be fully depleted of mobile charge carriers of the second conductivity type nor the first mesa 101 including the first channel region 1012 that may also be fully depleted of mobile charge carriers of the second conductivity type. Rather, the second cell 142 may be configured to block flow of the second load current 152 through the second mesa 102, thereby avoiding that mobile charge carriers of the second conductivity type leave the semiconductor body 10 during the conducting state of the semiconductor device 1. In other words, during the conducting state, the magnitude of the second load current 152 within each of the first mesa 101 and the second mesa 102 according to one embodiment may amount to substantially zero. According to another embodiment, a certain portion of the load current of up to 30% or up to 20% or up to 10% may be conducted by the second load current 152 which may traverse at least one of the first mesa 101 and second mesa 102.

In the following, the term "fully depleted channel region" intends to describe a channel region that is fully depleted of mobile charge carriers of the second conductivity type, wherein mobile charge carriers of the first conductivity type may still be present to a substantial extent in the fully depleted channel region. The same definition applies to the term "fully depletable channel region".

For example, the fully depleted first channel region 1012 does not include any mobile charge carriers of the second conductivity type or at least no mobile charge carrier density of the second conductivity type above a leakage current level. Further, in an embodiment, the fully depleted second channel region 1022 does not include any mobile charge carriers of the second conductivity type or at least no mobile charge carrier density of the second conductivity type above a leakage current level.

Thus, in accordance with an embodiment, the channel regions 1012 and 1022 are fully depleted regions in a conducting state of the semiconductor device 1.

For example, the channel regions 1012 and 1022 are fully depleted. This can be achieved by, e.g., choosing materials for the control electrodes 131 and 132 resulting in work functions of the control electrodes 131, 132 which may differ from those of the channel regions 1012 and/or 1022. Additionally or alternatively, this can be achieved by setting the control electrodes 131 and 132 to an appropriate electrical potential with respect to, e.g., the electrical potential of the first load terminal structure 11. Thus, in an embodiment, full depletion of the channel regions 1012, 1022 can be achieved due to a difference between the work function(s) of one or both of the control electrodes 131, 132 on the side and the work functions(s) of one or both of the channel regions 1012, 1022 on the other side and due to setting one or both of the control electrodes 131, 132 to a defined electrical potential.

For example, if the semiconductor device 1 is set into the conducting state, e.g., by applying a voltage within said first range between each of the control electrodes 131 and 132 on the one side and the first load terminal structure 11 on the other side (e.g., the electrical potential of each of the control electrodes 131 and 132 can be greater than the electrical potential of the first load terminal structure 11), the channel regions 1012 and 1022 may become fully depleted of mobile charge carriers of the second conductivity type. In the first channel region 1012, there may then be significantly less mobile charge carriers of the second conductivity type, e.g., holes as compared to a state wherein no positive voltage is applied. And, in the second channel region 1022, there may then also be significantly less mobile charge carriers of the second conductivity type, e.g., holes. For example, the formulation "significantly less mobile charge carriers" intends to describe, in this specification, that the amount of mobile charge carriers of the respective conductivity type is less than 10% of the mobile charge carriers of the other conductivity type.

In accordance with an embodiment, the semiconductor device 1 is configured to fully deplete the first channel region 1012 of charge carriers of the second conductivity type if a voltage applied between the first control electrode 131 and the first load terminal structure 11 is within said first range, e.g., within a range of −3 V to +3 V. According to another embodiment, the semiconductor device 1 is configured to fully deplete the first channel region 1012 if an electric field applied between the first control electrode 131 and the first load terminal structure 11 is within a first range, e.g., within a range of −10 MV/cm to +10 MV/cm or within a range of −6 MV/cm to +6 MV/cm or within a range of −4 MV/cm to +4 MV/cm. The same may apply analogously to the second channel region 1022.

For example, in a blocking state of the semiconductor device 1, only a current path for the second load current 152 exists in at least one of the channel regions 1012 and 1022, e.g., only in the channel region 1022, thus allowing an eventual leakage current to pass. As described above, a forward voltage applied between the load terminal structures 11 and 12 of the semiconductor device 1 may induce a space charge region at a junction formed at a transition to the drift region 100.

For switching the semiconductor device 1 from the conducting state to the blocking state, a voltage within a second range different from the first range may be applied between the first control electrode 131 and the first load terminal structure 11 so as to cut off the load current path in the first channel region 1012. For example, the second range may range from 0 V to a particular negative voltage value in case the load current path in the first channel region 1012 to be cut off is an electron current path. Accordingly, the second range may range from 0 V to a particular positive voltage value in case the load current path in the first channel region 1012 to be cut off is a hole current path. The same voltage or another voltage in the second range or yet another voltage may also be applied between the second control electrode 132 and the first load terminal structure 11. Then, an accumulation channel of mobile charge carriers of the second conductivity type may be induced in the second channel region 1022. Further, in an embodiment the second channel region 1022 is not depleted, but forms a conductive connection towards the first load terminal structure 11 due to dopants of the second conductivity type. For example, the accumulation channel may facilitate movement of the second charge carriers of the second conductivity type out of the semiconductor body 10 to the first load terminal structure 11. This may contribute to a fast reduction of the total charge carrier concentration in the semiconductor body 10 during switch-off of the semiconductor device 1.

For switching the semiconductor device 1 from the blocking state to the conducting state, a voltage within the first range may be applied between the first control electrode 131 and the first load terminal structure 11, as described above. A current path for mobile charge carriers of the first conductivity type may then be induced in the first channel region 1012, e.g., by formation of an inversion channel. The inversion channel may extend over the whole first channel region 1012 along the extension direction Z. In a variant, the inversion channel may extend over the whole first channel region 1012 also along the first lateral direction X and/or the second lateral direction Y. At the same time, the first channel region 1012 may become fully depleted of mobile charge carriers of the second conductivity type due to said voltage being within said first range such that a flow of mobile charge carriers of the second conductivity through the first channel region 1012 between the semiconductor body 10 and the first load terminal structure 11 is inhibited. The same voltage or another voltage in the first range or yet another voltage may further be applied between the second control electrode 132 and the first load terminal structure 11. The second channel region 1022 may then become fully depleted of mobile charge carriers of the second conductivity type such that a flow of mobile charge carriers of the second conductivity through the second channel region 1022 between the semiconductor body 10 and the first load terminal structure 11 is reduced or inhibited.

The semiconductor body 10 may further comprise a third port region 103 electrically connected to the second load terminal structure 12 and coupled to the drift region 100. The third port region 103 may be a third semiconductor port region. For example, the third port region 103 comprises a first emitter having the second conductivity type and/or a second emitter having the first conductivity type, e.g., so-called n-shorts (in case the first conductivity type is n), in order to implement a reverse conductivity of the semiconductor device 1. Further, the third port region 103 may comprise a buffer region, also known as field stop region, which may include, e.g., dopants of the same conductivity type as the drift region 100, e.g., of the first conductivity type, but a higher dopant concentration as compared to the dopant concentration of the drift region 100. However, since these exemplarily configurations of the third port region 103 are generally known to the skilled person, the first emitter, the second emitter and the buffer region are neither illustrated in FIG. 3 nor explained herein in more detail.

As has been explained above, the semiconductor body 10 can be configured to conduct the total load current 15 in the forward direction between said load terminal structures 11 and 12. To this end, the first control electrode 131 may be configured to induce, in response to receiving said first control signal, an inversion channel for conducting the first load current 151 within the first channel region 1012. For example, in response to receiving the first control signal, the semiconductor device 1 can be configured to fully deplete the first channel region 1012 regarding mobile charge carriers of the second conductivity type. Accordingly, in response to receiving the second control signal, the semiconductor device 1 can further be configured to fully deplete the second channel region 1022 regarding mobile charge carriers of the second conductivity type.

In accordance with an embodiment, the first load terminal structure 11 includes a source terminal (also referred to as "emitter terminal") and the second load terminal structure 12 includes a drain terminal (also referred to as "collector terminal") and the control terminal structure 13 includes a gate terminal. Thus, the first port region 1011 of the first mesa 101 may constitute a source region, e.g., a semiconductor source region.

For example, for setting the semiconductor device 1 into a conducting state, during which the total load current 15 between the load terminal structures 11, 12 may be conducted in a forward direction, the first control electrode 131 may be provided with the first control signal having a voltage within a first range so as to induce an inversion channel within a first channel region 1012. For example, the voltage is applied between the first control electrode 131 and the first load terminal structure 11. In an embodiment, the electrical potential of the first control electrode 131 is greater than the electrical potential of the first load terminal structure 11 if the applied voltage is within the first range.

For setting the semiconductor device 1 into a blocking state in which a voltage applied between the second load terminal structure 12 and the first load terminal structure 11 in the forward direction may be blocked and flow of the load current 15 in the forward direction is prevented, the first control electrode 131 may be provided with the control signal having a voltage within the second range different from the first range so as to induce a depletion region, e.g., at a transition between the first channel region 1012 and the drift region 100. For example, the voltage is applied between the first load terminal structure 11 and the first control electrode 131. In an embodiment, the electrical potential of the first control electrode 131 is equal to or lower than the electrical potential of the first load terminal structure 11 if the applied voltage is within the second range.

For example, the structure as schematically illustrated in each of FIGS. 1A to 3B can be employed for forming one or more device cells of an IGBT, an RC-IGBT, a MOSFET and the like. In an embodiment, the semiconductor device 1 is one of an IGBT, an RC-IGBT or a MOSFET.

According to the aforesaid, an embodiment of the operation and the configuration of the semiconductor device 1 can be summarized as follows. The semiconductor device 1 can be configured to be set into the conducting state by providing the control signal with a voltage within said first range. In response to receiving such control signal, the first cell 141 may be configured to induce an inversion channel within the first channel region 1012 such that the first load current 151 of first charge carriers of the first conductivity type may traverse the first mesa 101. Simultaneously, the first cell 141 may be configured to fully deplete the first channel region 1012 with regards to charge carriers of the second conductivity type and to thus drastically reduce or inhibit a flow of the second load current 152 within the first mesa 101. Further, in response to receiving such control signal, the second cell 142 may be configured to fully deplete the second channel region 1022 with regards to charge carriers of the second conductivity type and to thus inhibit a flow of each of first load current 151 and the second load current 152 within the second mesa 102. Thus, during the conducting state, the total load current within the cells 141 and 142 may be at least dominated or even constituted by the substantially the first load current 151 only, as the second load current 152 substantially amounts to zero within said cells 141 and 142. For switching the semiconductor device 1 from the conducting state to the blocking state, the control signal may be provided with a voltage within said second range different form the first range. In response to receiving such control signal, the semiconductor device 1 may be configured to cause movement of mobile charge carriers out of the semiconductor body 10. To this end, the first cell 141 may be configured to cut-off the first load current 151 within the first mesa 101 by breaking down said inversion channel. Simultaneously, the second cell 142 may be configured to induce an accumulation channel within the second channel region 1022 so as to allow flow of the second load current 152 within the second mesa. In fact, such second load current 152 can be considered to a be a removal current, as it causes the semiconductor body 10 to be depleted regarding second charge carriers of the second conductivity type. Thus, during switch-off, the total load current 15 within the cells 141 and 142, i.e., the total load current 15 in proximity to the first load terminal structure 11, may dominated by or even substantially be constituted by the second load current 152 within the second cell 142.

Figure 4:
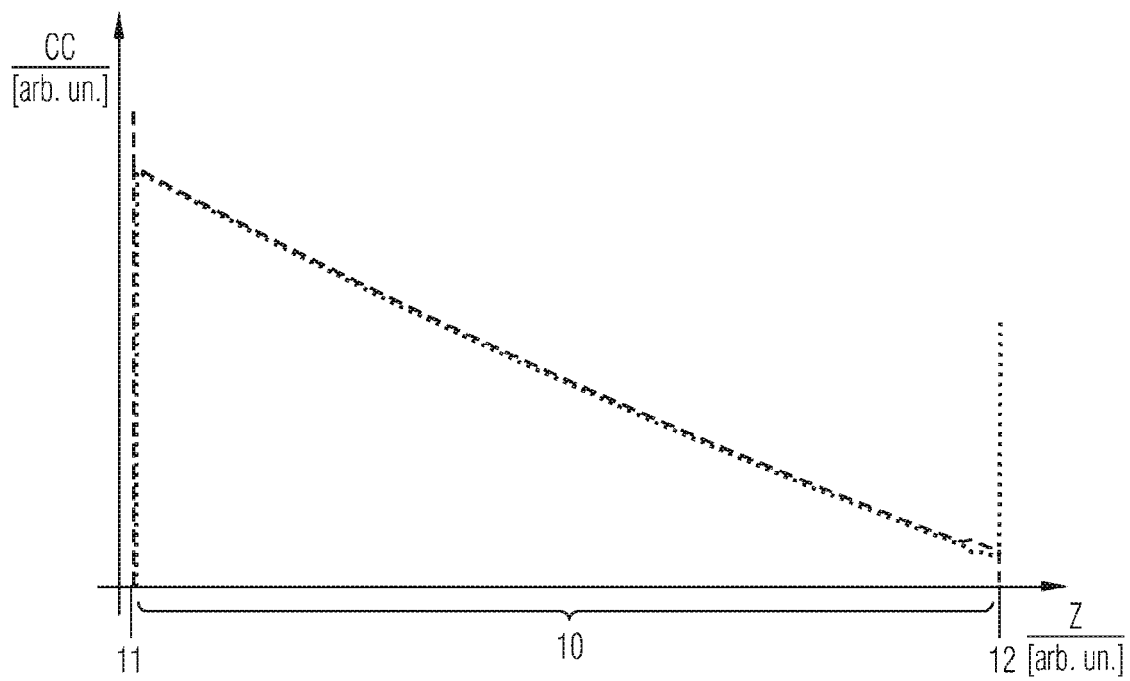
FIG. 4 schematically illustrates distributions of charge carrier concentrations in a semiconductor body of a power semiconductor device in accordance with one or more embodiments.

FIG. 4 schematically illustrates exemplary distributions of charge carrier concentrations in the semiconductor body 10 of the semiconductor device 1 when being in the conducting state, in accordance with one or more embodiments. The dashed line exemplarily illustrates the distribution of the concentration (CC) of charge carriers of the first conductivity type, e.g., electrons, along the extension direction Z, and the dotted line exemplarily illustrates the distribution of the concentration (CC) of charge carriers of the second conductivity type, e.g., holes, along the extension direction Z. As illustrated, in proximity to the first load terminal structure 11, e.g., within the cells 141 and 142 the concentration of the charge carriers of the first conductivity type can be higher as compared to the concentration of the charge carriers of the second conductivity type, e.g., due to the reasons as they were outlined in the preceding paragraph and because doping regions in the cells 141 and 142 may contribute to the curves.

Along the extension of the semiconductor body 10 in the extension direction Z, e.g., within the drift region 100, the concentration of the charge carriers of the first conductivity type can be substantially equal to the concentration of the charge carriers of the second conductivity type, e.g., due to the physical requirement of charge neutrality that may be established within the electron-hole plasma inside the drift region 100.

In proximity to the second load terminal structure 12, the concentration of the charge carriers of the second conductivity type may be significantly higher as compared to the concentration of the charge carriers of the first conductivity type, e.g., since charge carriers of the first conductivity type may continuously move from the semiconductor body 10 to the second load terminal structure 12, and wherein charge carriers of the second conductivity type may be continuously pumped into the drift region 100 out of said first emitter that may be included within the third port region 103 electrically connected to the second load terminal structure 12, wherein the first emitter may have the second conductivity type. According to another embodiment not illustrated in FIG. 4, in proximity of the second load terminal structure 12, also the density of the charge carriers of the first conductivity type may be much larger in an area close to a doping region of the first conductivity type, e. g., in order to implement a reverse conductivity of the semiconductor device 1 as stated earlier. In an area of a buffer or field stop region, differences in the densities of the charge carriers of the first and second conductivity type may occur.

For example, the semiconductor device 1 may be configured to induce, within the semiconductor body 10, e.g., within the drift region 100, a total concentration of charge carriers greater than $10^{16}$ cm$^{-3}$, or even greater than $10^{17}$ cm$^{-3}$, or even greater than $2*10^{17}$ cm$^{-3}$. Such high concentration of charge carriers may allow for achieving a comparatively low on-state voltage during the conducting state, i.e., a voltage between the first load terminal structure 11 and the second load terminal structure 12 of less than 1 V, less than 0.9 V, or even less than 0.8 V at a nominal load current or at a load current density flowing through a horizontal cross-section of the semiconductor device 1 of at least 100 A/cm$^2$ and at about 20° C. Said on-state voltage may be substantially caused by a pn-junction (not illustrated) in proximity to the second load terminal structure 12. Thus, the drop of the on-state voltage may be asymmetrically distributed along the distance between the first load terminal structure 11 and the second load terminal structure 12, e.g., due to the main change in voltage occurring in proximity to the second load terminal structure 12 and a negligible voltage change occurring in proximity to the first load terminal structure 11. If, for example, the semiconductor body 10 is mainly based on silicon (Si), an on-state voltage of significantly less than 0.7 V can hardly be achieved.

Figure 5A:
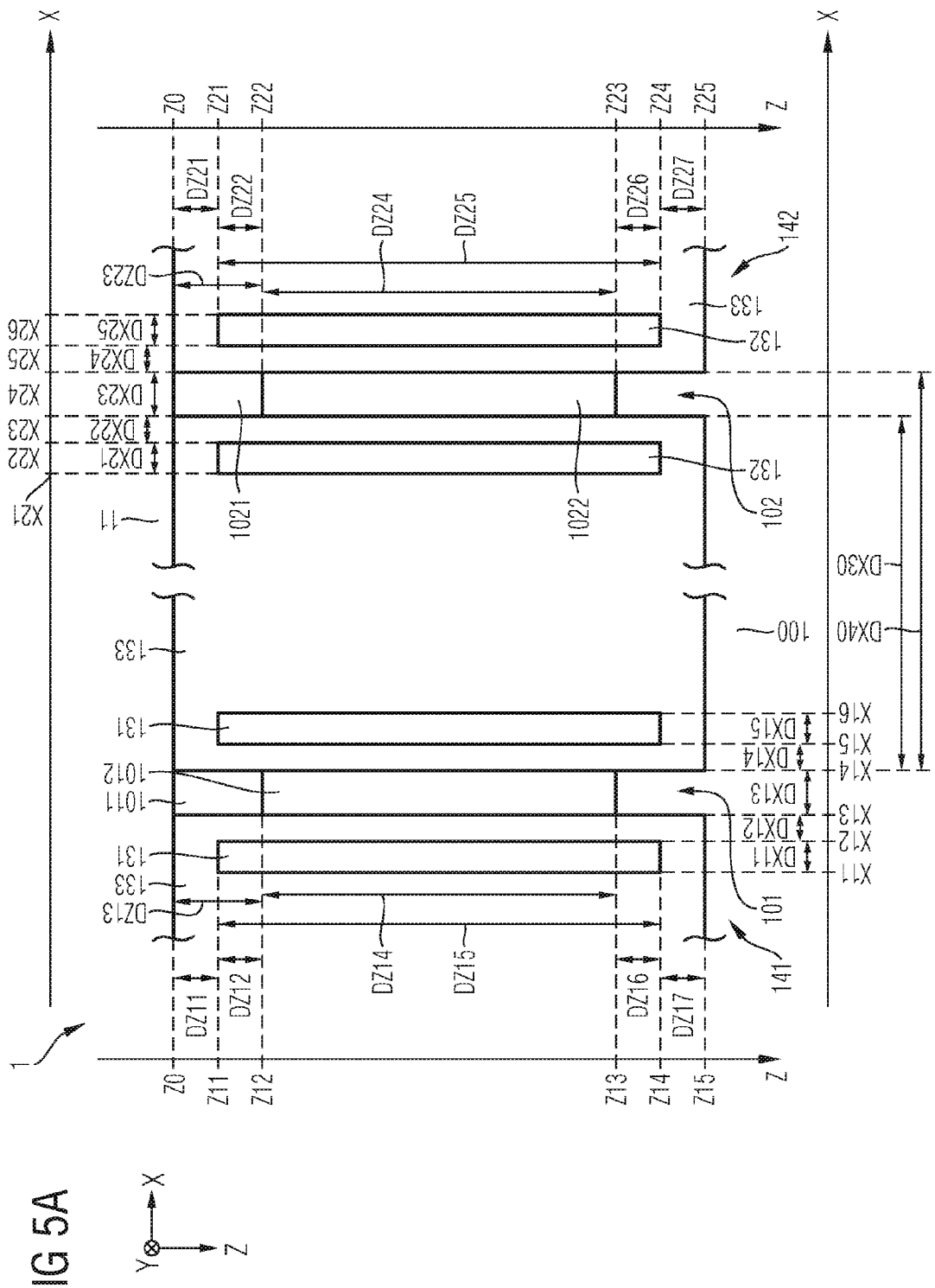
FIG. 5A schematically illustrates a section of a vertical cross-section of a power semiconductor device in accordance with one or more embodiments.

With regards to FIG. 5A, some exemplarily spatial dimensions of the first cell 141 and the second cell 142 shall be explained. Before giving specific values, it shall be understood that the cells 14 including the first cell 141 and the second cell 142 may either exhibit a stripe configuration or a needle configuration, as has been explained with respect to FIG. 1A.

Figure 5B:
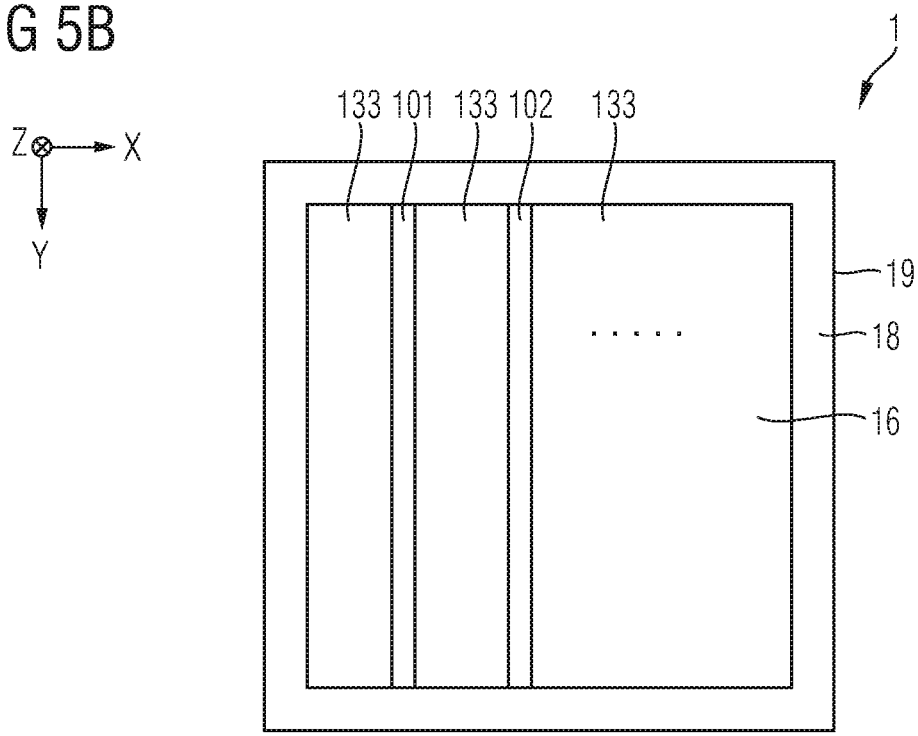
FIGS. 5B-C each schematically illustrate sections of a horizontal projection of a power semiconductor device in accordance with one or more embodiments.

In the first case ("stripe"), as schematically illustrated in FIG. 5B, each of the first mesa 101 and the second mesa 102 may exhibit the shape of a fin that has a total lateral extension along the one lateral direction (e.g., Y) that amounts to at least a multiple of the total lateral extension in the other lateral direction (e.g., X). For example, the fin shaped mesa 101 and 102 may extend substantially along the entire active cell field 16 in one lateral direction.

Figure 5C:
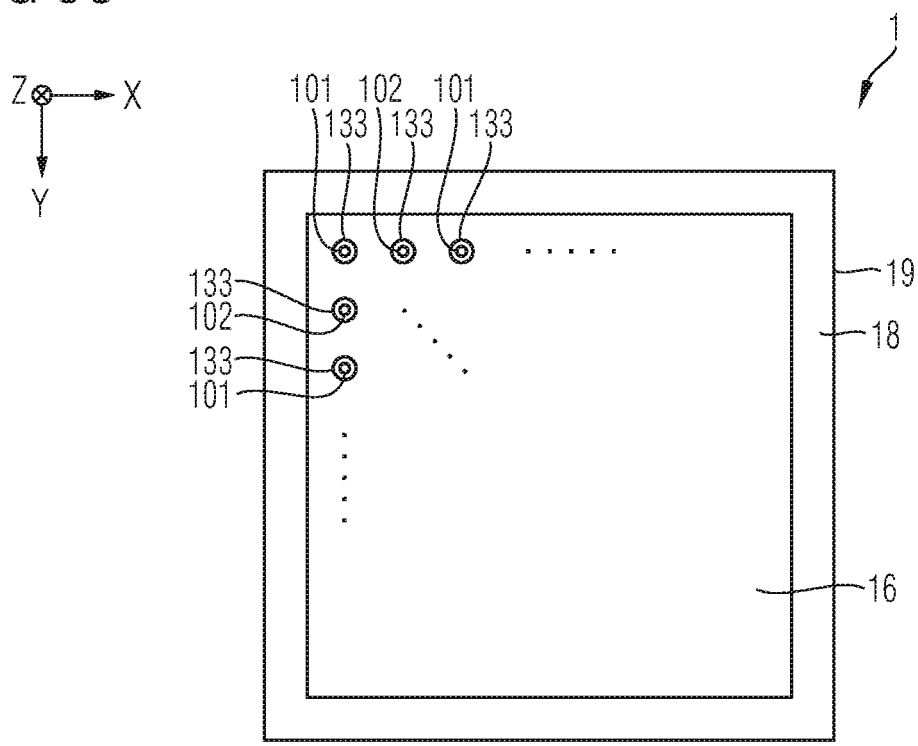

In the second case ("needle"), as schematically illustrated in FIG. 5C, each of the first mesa 101 and the second mesa 102 may exhibit the shape of a wire. For example, the mesa 101 and 102 may each have a circular or rectangular cross-section in parallel to a horizontal plane and may each be completely surrounded by the insulation structure 133.

Thus, in accordance with the embodiment schematically illustrated in FIG. 5A, the cells 141 and 142 may exhibit a needle configuration or a stripe configuration, for example. In another embodiment, the first cell 141 may exhibit a stripe configuration and the second cell 142 may exhibit a needle configuration or vice versa.

In an embodiment, the first port region 1011 and the second port region 1021 each extend, from their respective contact with the first load terminal structure 11 at the level Z0 (which may be at 0 nm), along the extension direction Z to a level Z12 or, respectively, to a level Z22, which may each be within the range of 30 nm to 500 nm, within the range of 50 nm to 400 nm, or within the range of 50 nm to 300 nm. The levels Z12 and Z22 may be substantially identical to each other. Accordingly, along the extension direction Z, the first port region 1011 may have a total extension DZ13 within the range of 30 nm to 500 nm, within the range of 50 nm to 400 nm, or within the range of 50 nm to 300 nm, and the second port region 1021 may have a total extension DZ23 in the extension direction Z substantially identical to DZ13.

Further, the first channel region 1012 and the second channel region 1022 may each extend, from the contact with the first port region 1011 at the level Z12 or, respectively, from the contact with the second port region 1021 at the level Z22, along the extension direction Z to a level Z13 or, respectively, to a level Z23, which may each be within the range of 50 nm to 700 nm, within the range of 60 nm to 550 nm, or within the range of 100 nm to 400 nm. The levels Z13 and Z23 may be identical to each other. Accordingly, along the extension direction Z, the first channel region 1012 may have a total extension DZ14 within the range of 50 nm to 700 nm, within the range of 80 nm to 550 nm, or within the range of 150 nm to 400 nm, and the second channel region 1022 may have a total extension DZ24 in the extension direction Z substantially identical to DZ14.

The first control electrode 131 and the second control electrode 132 may be spaced apart from the first load terminal structure 11 along the extension direction Z by a distance DZ11 or, respectively, DZ21, which may be equal to DZ11. Thus, said distances DZ11 and DZ21 may be identical to the thickness of the section of the insulation structure 133 that isolates the control electrodes 131 and 132 from the first load terminal structure 11 along the extension direction Z. Each of DZ11 and DZ21 can be within the range of 10 nm to 490 nm, within the range of 20 nm to 180 nm, or within the range of 50 nm to 250 nm. In other words, the first control electrode 131 may exhibit a proximal end that is arranged at a level Z11 corresponding to DZ11 in terms of magnitude, and the second control electrode 132 may exhibit a proximal end that is arranged at a level Z21 corresponding to DZ11 in terms of magnitude.

In an embodiment, the first control electrode 131 may exhibit a total extension DZ15 along the extension direction Z that is greater than the total extension DZ14 of the first channel region 1012 and can be arranged such that it exhibits a common extension range along the extension direction Z with the first channel region 1012 greater than 100% of the total extension DZ14 of the first channel region 1012, as schematically illustrated in FIG. 5A. Thus, said total extension DZ15 of the first control electrode 131 may amount to at least a factor of 1.1 of DZ14, a factor of 1.3 of DZ14 or even to a factor of 1.5 of DZ14. Against the extension direction Z, there may be an overlap DZ12 within the range of 10 nm to 490 nm, within the range of 20 nm to 380 nm, or within the range of 50 nm to 250 nm, which may be, at the same time, a common extension range with the first port region 1011. In the extension direction Z, the first control electrode 131 may exhibit an overlap DZ16 within the range of 10 nm to 490 nm, within the range of 20 nm to 380 nm, or within the range of 50 nm to 250 nm, which may be, at the same time, a common extension range with the drift region 100. Further, the first control electrode 131 may exhibit a distal end at a level Z14 that is spaced apart from a distal end of the insulation structure 133 at a level Z15 by a distance DZ17, which may be within the range of 60 nm to 1200 nm, within the range of 100 nm to 900 nm, or within the range of 200 nm to 650 nm.

In an embodiment, the effective thickness DX12/DX14 of the insulation structure 133 insulating the first control electrode 131 from the first channel region 1012 along the first lateral direction X is smaller than the effective thickness DZ17 of the insulation structure 133 insulating the first control electrode 131 from the semiconductor body 10 along the load current direction Z, i.e., the extension direction Z. For example, each of DX12 and DX14 amount to no more than 90% of DZ17, to no more than 75% of DZ17 or to even less than 50% of DZ17. However, in an embodiment, whereas DZ17 can hence be greater than each of DX12 and DX14, the factor between DZ17 and DX12 (or Dx14) amounts to less than 6, or to less than 3.

What has been stated above with respect to the extension and the arrangement the first control electrode 131 along the extension direction Z may equally apply to the second control electrode 132 and its relative position with respect to the second channel region 1022. Thus, the values of DZ25 may be within the same range as DZ15, the values of DZ21 may be within the same range as DZ11, the values of DZ22 may be within the same range as DZ12, and the values of DZ26 may be within the same range as DZ16. Further, the second control electrode 132 may exhibit a distal end at level Z24 that is spaced apart from a distal end of the insulation structure 133 at level Z25 by a distance DZ27, wherein the values of DZ27 may be within the same range as DZ17.

In an embodiment, the effective thickness DX22/DX24 of the insulation structure 133 insulating the second control electrode 132 from the second channel region 1022 along the first lateral direction X is smaller than the effective thickness DZ27 of the insulation structure 133 insulating the second control electrode 132 from the semiconductor body 10 along the load current direction Z, i.e., the extension direction Z. For example, each of DX22 and DX24 amount to no more than 90% of DZ27, to no more than 75% of DZ27 or to even less than 50% of DZ27. However, in an embodiment, whereas DZ27 can hence be greater than each of DX22 and DX24, the factor between DZ27 and DX22 (or DX24) amounts to less than 6, or to less than 3.

Along the first lateral direction X, the first control electrode 131 may be spaced apart from the first channel region 1021 by a distance DX12 that may be within the range of 1 nm to 100 nm, within the range of 2 nm to 50 nm, or within the range of 3 nm to 20 nm. Said distance DX12 may be identical to a thickness of the insulation structure 133 that isolates the first control electrode 131 from the first mesa 101 along the first lateral direction X. Accordingly, along the first lateral direction X, the second control electrode 132 may be spaced apart from the second channel region 1022 by a distance DX22 that may be within the range of 1 nm to 100 nm, within the range of 2 nm to 50 nm, or within the range of 3 nm to 20 nm. Said distance DX22 may be identical to a thickness of the insulation structure 133 that isolates the second control electrode 132 from the second mesa 102 along the first lateral direction X.

The thickness DX11 of the first control electrode 131 along the first lateral direction X may be within the range of 10 nm to 10,000 nm, within the range of 50 nm to 7,000 nm, or within the range of 100 nm to 5,000 nm. The thickness DX21 of the second control electrode 132 along the first lateral direction X may be in same range as the thickness DX11 or in another of said ranges described above with regard to the thickness DX11. As mentioned in the above, in contrast to the exemplary schematic representation in FIG. 5A, the control electrodes 131 and 132 can be in contact with each other (i.e., in FIG. 5A, X16 would be equal to X21) in accordance with one or more embodiments, thereby forming a joint control electrode that may be used for controlling each of the first cell 141 and the second cell 142.

In the embodiment in accordance with FIG. 5A, the cells 141 and 142 may exhibit a needle configuration or a stripe configuration, as has been explained above. For example, in the first case ("needle") the cells 141 and 142 may each exhibit, e.g., a radially symmetrical structure and the section of the vertical cross-section of FIG. 5A indeed only depicts a single first control electrode 131 exhibiting, e.g., a cylinder shape, and a single second control electrode 132 exhibiting, e.g., also a cylinder shape coating the first mesa 101 or, respectively, the second mesa 102. In this case, each of the first lateral direction X and the second lateral direction Y denotes a radial direction. Further, the needle cells could also exhibit, in parallel to the YX plane, a rectangular cross-section, e.g., with rounded corners or an elliptical cross-section. In the second case ("stripe"), the first cell 141 may comprise a monolithic first control electrode 131 that flanks the first mesa 101 only on one lateral side, and, accordingly, the second cell 142 may also comprise a monolithic second control electrode 132 that flanks the second mesa 102 only on one lateral side. In another embodiment, as illustrated in FIG. 5A, the first control electrode 131 can be a multi-part, e.g., a two-part first electrode 131, and the second control electrode 132 can also be a multi-part, e.g., a two-part second electrode 132. For example, in accordance with the embodiment of FIG. 5A, if the cells 141 and 142 exhibit a stripe configuration, the first control electrode 131 may be a two-part first control electrode 131 arranged mirror symmetrically along the first lateral direction X with regards to the first mesa 101, and the second control electrode 132 may be a two-part second control electrode 132 arranged mirror symmetrically along the first lateral direction X with regards to the second mesa 102. Thus, what has been stated above with respect to the dimension DX11, DX21 and DX12, DX22 may equally apply to the dimensions DX14, DX24 and DX15, DX25 indicated in FIG. 5A.

As has been explained above, the spatial dimensions of the mesa 101 and 102 and their components may each be confined by the insulation structure 133. The total extension Z15 of each of the first mesa 101 and the second mesa 102 in parallel to the path of the first load current 151 or, respectively, the second load current 152, which may be in parallel to the extension direction Z, may amount to at least a multiple of the respective total extensions DX13, DX23 perpendicular to the load current paths, e.g., in at least one of the first lateral direction X and the second lateral direction Y.

For example, the width DX13 of the first channel region 1012 of the first mesa 101 in a direction perpendicular to the course of the first load current 151 within the first mesa 101, e.g., in a direction perpendicular to the extension direction Z, e.g., the first lateral direction X, may be smaller than 100 nm, smaller than 60 nm, or even smaller than 40 nm over a distance in a direction of first load current 151 within the first mesa 101, e.g., along a direction in parallel to the extension direction Z, amounting to at least three times of DX13. For example, the first channel region 1012 may exhibit a width of DX13 smaller than 100 nm along at least 300 nm in the extension direction Z, a width of DX13 smaller than 60 nm along at least 180 nm in the extension direction Z, or a width of DX13 smaller than 40 nm along at least 120 nm in the extension direction Z.

Analogously, the width DX23 of the second channel region 1022 of the second mesa 102 in a direction perpendicular to the course of the second load current 152 within the second mesa 102, e.g., in a direction perpendicular to the extension direction Z, e.g., the first lateral direction X, may be smaller than 100 nm, smaller than 60 nm, or even smaller than 40 nm over a distance in a direction of second load current 152 within the second mesa 102, e.g., along a direction in parallel to the extension direction Z, amounting to at least three times of DX23. For example, the second channel region 1022 may exhibit a width of DX23 smaller than 100 nm along at least 300 nm in the extension direction Z, a width of DX23 smaller than 60 nm along at least 180 nm in the extension direction Z, or a width of DX23 smaller than 40 nm along at least 120 nm in the extension direction Z.

It shall be understood that, in contrast to the schematic representation in FIG. 5A, the insulation structure 133 must not necessarily extend at least as far in the extension direction Z as the first control electrode 131 along the entire distance DX30 between the first mesa 101 and the second mesa 102, but may extend less in the extension direction Z, e.g., being in the same range as the total extension of the first port region 1011 or, respectively, the total extension of the second port region 1021 in the extension direction Z (DZ13, DZ23 in FIG. 5A), e.g., along at least 80% of the distance DX30 between the first mesa 101 and the second mesa 102.

The distance between the first cell 141 and the second cell 142 along one of the first lateral direction X and the second lateral direction Y, in the following also referred to as "inter-cell pitch" DX40, may be within the range of 100 nm to 15,000 nm, within the range of 300 nm to 10,000 nm, or within the range of 500 nm to 8,000 nm.

In an embodiment, the first mesa 101 is dimensioned in accordance with following equation (1) presented below $$DX13 \le 2 * W\max; \; W\max = \sqrt{\frac{4 * \varepsilon * k * T * \ln\left(\frac{N_A}{n_i}\right)}{q^2 * N_A}}$$

Accordingly, in an embodiment, DX13, i.e., the width of the first channel region 1011, is equal to or smaller than twice of a maximal width Wmax along at least 80%, at least 90%, or along at least 95%, or even along at least 99% of the total extension of the first mesa 101 in the extension direction Z, the maximal width Wmax being determined in accordance with equation (1) presented above, wherein
□=dielectric constant of the material of the first channel region 1012;
k=Boltzmann constant;
T=Temperature;
ln denotes the natural logarithm;
$N_A$=dopant concentration of the material of the first channel region 1012;
$n_i$=intrinsic carrier concentration (e.g., $1.45*10^{10}$ in case of Si at 27° C.); and
q=elementary charge.

In an embodiment, the second mesa 102 is accordingly dimensioned, i.e., DX23 being equal to or smaller than twice of a maximal width Wmax along at least 80%, at least 90%, or along at least 95%, or even along at least 99% of the total extension of the first mesa 101 in the extension direction Z, the maximal width Wmax being determined with values applicable for the second channel region 1022.

For example, each of DX13 and DX23 is within a range of 15 nm to 100 nm, while each of the dopant concentration of the first channel region 1012 and the dopant concentration of the second channel region 1022 is greater than $8*10^{18}$ $cm^{-3}$.

In an embodiment, each of the first port region 1011, the first channel region 1012, the second port region 1021 and the second channel region 1022 may thus constitute a nanometer-scale structure having a spatial dimension in at least one of the first lateral direction X, the second lateral direction Y and the extension direction Z of less than 100 nm. In an embodiment, said at least one direction along which the respective region exhibits an extension of less than 100 nm is perpendicular to the direction of the applicable load current conducted within the respective region.

In accordance with the embodiment that is schematically and exemplarily illustrated in FIG. 6, the semiconductor body 10 may further comprise a first plateau region 1013 and a second plateau region 1023.

The first plateau region 1013 may be in contact with the first channel region 1012 and may exhibit dopants of a conductivity type complimentary to the dopants of the first channel region 1012. Thus, the first plateau region 1013 may have the first conductivity type.

The second plateau region 1023 may be arranged between the second channel region 1022 and the semiconductor drift region 100; e.g., it may be in contact with the second channel region 1022 and may exhibit dopants of a conductivity type identical to the dopants of the second channel region 1022. Thus, the second plateau region 1023 may have the second conductivity type.

In an embodiment, second plateau region 1023 may extend deeper (e.g., along the extension direction Z) into the semiconductor body 10 than the second mesa 102, wherein, in a section arranged deeper than the second mesa 102, the second plateau region 1023 can extend laterally (e.g., in parallel to the first lateral direction X) from the second mesa 102 towards the first mesa 101. A lateral extension of the section in this direction can be at least 50% of the distance (cf. reference numeral DX30 in FIG. 5A) between the first mesa 101 and second mesa 102. Said lateral extension can be even greater, e.g., greater than 75% of DX30.

For example, at least a section of the second plateau region 1023 that extends laterally towards the first mesa 101 can be arranged spatially displaced from the insulation structure 133 along the extension direction Z.

Further, the second plateau region 1023 may be configured to electrically couple to the second port region 1021 if an accumulation channel is induced in the second channel region 1022.

For example, the second plateau region 1023 extends towards the first control electrode 131 and the first plateau region 1013 extends towards the second control electrode 132. For example, the second plateau region 1023 and the first control electrode 131 may exhibit a common lateral extension range DX80. In an embodiment, DX80 may amount to at least 50% of the thickness of the first control electrode 131 along the first lateral direction X (cf. reference numeral DX15 in FIG. 5A), or to at least 75% of DX15. For example, the second plateau region 1023 may hence extend close towards the first mesa 101.

For example, the distance between the first mesa 101 and the second mesa 102 along the first lateral direction X amounts to less than 200 nm, to less than 150 nm or to even less than 100 nm. Further, the second plateau region 1023 may exhibit a varying dopant concentration along the extension direction Z that may exhibit, e.g., a maximum at approximately a center of the average total extension DZ30 along the extension direction Z.

For example, the first plateau region 1013 extends towards the second control electrode 132. The first plateau region 1013 and the second plateau region 1023 may be in contact with each other and may exhibit a common lateral extension range DX90 of at least 20 nm, of at least 50 nm or of more than 100 nm along the first lateral direction X. The common lateral extension range DX90 may comprise the common lateral extension range DX80 at least partially. Thus, also the first plateau region 1013 and the first control electrode 131 may exhibit a common lateral extension range. Further, the first plateau region 1013 may exhibit a varying dopant concentration along the extension direction Z that may exhibit, e.g., a maximum at approximately a center of the average total extension DZ40 along the extension direction Z.

In an embodiment, the second plateau region 1023 extends further into the semiconductor drift region 100 along the extension direction Z as compared to the first plateau region 1013.

Figure 7:
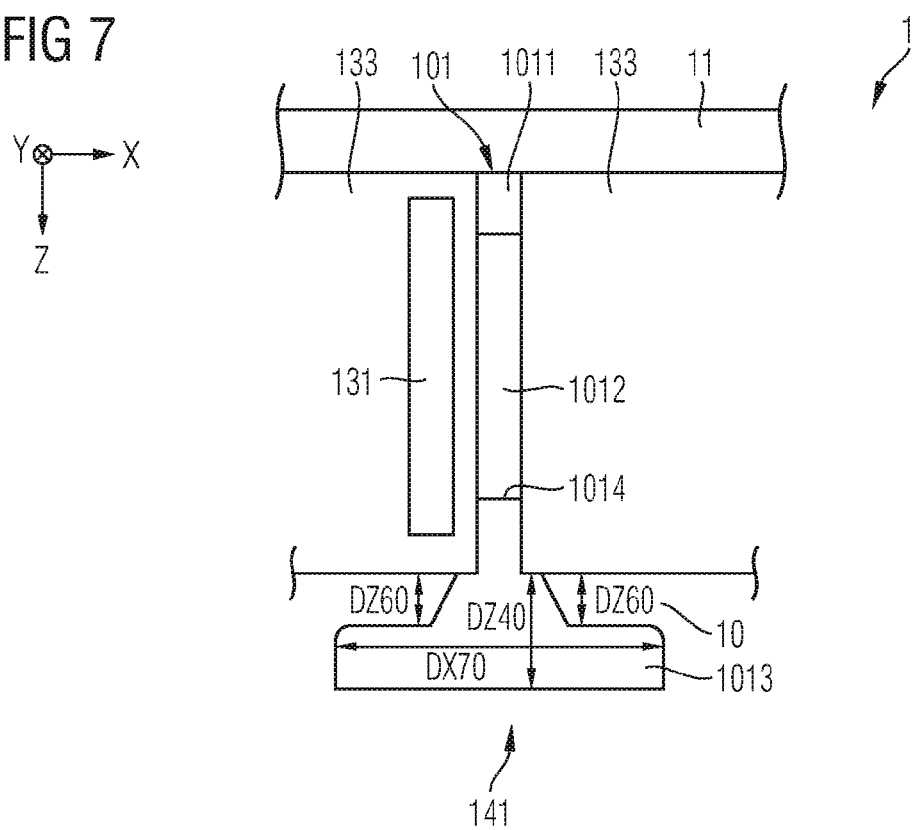
FIG. 7 schematically illustrates a section of a vertical cross-section of a power semiconductor device in accordance with one or more embodiments.
Figure 8:
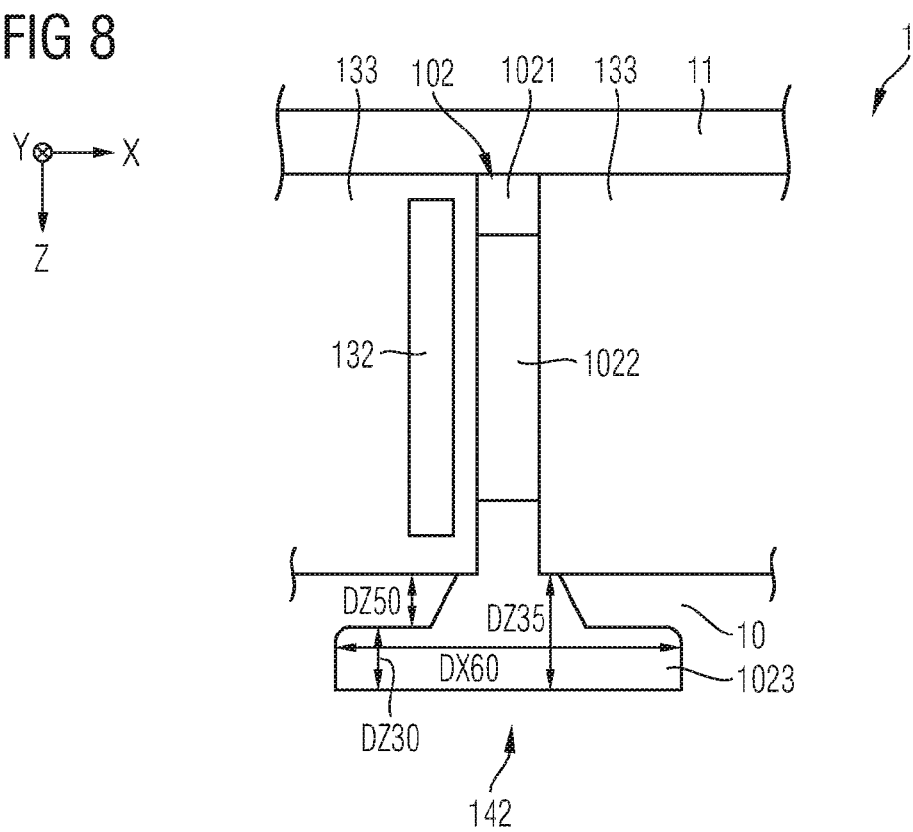
FIG. 8 schematically illustrates a section of a vertical cross-section of a power semiconductor device in accordance with one or more embodiments.

Further exemplary embodiments of the first plateau region 1013 and the second plateau region 1023 are schematically illustrated in FIG. 7 and in FIG. 8.

Accordingly, the first plateau region 1013 may be in contact with the first channel region 1012, wherein the transition 1014 between the two regions may be established within the first mesa 101. For example, in case of the first channel region 1012 having the second conductivity type and in case of the first plateau region 1013 having the first conductivity type, as in the example of FIG. 6, the transition 1014 between the first channel region 1012 and the first plateau region 1013 may establish a pn-junction. Said pn-junction may be established within the first mesa 101.

Starting at the transition 1014, the first plateau region 1013 may extend further along the extension direction Z than the first mesa 101 that is spatially confined by the insulation structure 133. In an embodiment, the dopant concentration of the first plateau region 1013 may vary along the extension direction Z. For example, at the transition to the first channel region 1012, the dopant concentration may be in the range of the dopant concentration of the drift region 100 and may then increase along the extension direction Z, e.g., to a peak value in the center (in terms of the extension along the extension direction Z) and then decrease again, e.g., to a value comparable to the drift region dopant concentration.

For example, external of the first mesa 101, the first plateau region 1013 may extend in both the extension direction Z and each of a direction in parallel to the first lateral direction X and in anti-parallel to the first lateral direction X. For example, in the section of the first plateau region 1013 that is arranged external of the first mesa 101, the first plateau region 1013 can be in contact with the insulation structure 133 over at least a portion of its total extension DX70 along the first lateral direction X, wherein said portion may be within the range of, e.g., 10% to 100% of DX70. A possibly remaining section of the total lateral extension along the first lateral direction X that is external of the first mesa 101 may be separated from the insulation structure 133 by means of the drift region 100, wherein the distance DZ60 along the extension direction Z may be within the range of up to 300 nm, within the range of up to 200 nm, or within the range of up to 150 nm. And, speaking of the insulation structure 133, as has been explained above, the control electrodes 131 and 132 may also be arranged in contact with each other in accordance with one or more embodiments, thereby forming a monolithic control electrode used for controlling each of the first cell 141 and the second cell 142. In other words, in an embodiment, the control electrodes 131 and 132 can be respective sections of one joint control electrode, yielding that the control electrodes 131 and 132—in contrast to the schematic and exemplary representation in FIG. 6—would not be separated from each other by the insulation structure 133.

The total lateral extension DX70 may be a at least a multiple of the width DX13 of the first mesa 101 (indicated in FIG. 5A), e.g., amounting to a factor within the range of 2 to 1000, within the range of 4 to 700, or within the range of 10 to 500 of DX13. Thus, DX70 can be, e.g., within the range of 40 nm to 10,000 nm, within the range of 80 nm to 7,000 nm, or within the range of 200 nm to 5,000 nm. Further, in the section of the first plateau region 1013 that is arranged external of the first mesa 101, the first plateau region 1013 may exhibit a total extension DZ40 along the extension direction Z, which may be in a similar range as the total extension Z15 (cf. FIG. 5A) of the first mesa 101 along the extension direction Z. For example, DZ40 can be within the range of up to 600 nm, within the range of up to 500 nm, or within the range of up to 400 nm. As illustrated in FIG. 7, the DZ40 may vary along the total extension in the first lateral direction X of the first plateau region 1013. Further, in contrast to the schematic and exemplary representation in FIG. 6, the first plateau region 1013 may extend further along first lateral direction X, e.g., close to the second mesa 102.

Further, regarding the exemplary embodiment in accordance with FIG. 8, the second plateau region 1023 may be in contact with the second channel region 1022, wherein the transition between the two regions may be established within the second mesa 102. However, in case of the second channel region 1022 having the second conductivity type and in case of the second plateau region 1023 having also the second conductivity type, as in the example of FIG. 6, the transition between the second channel region 1022 and the second plateau region 1023 may be established, e.g., by a change of a dopant concentration along the extension direction Z, only. Said change may be present within the second mesa 102.

Starting at said transition with the second mesa 102, the second plateau region 1023 may extend further along the extension direction Z than the second mesa 102 that is spatially confined by the insulation structure 133. For example, external of the second mesa 102, the second plateau region 1023 may extend in both the extension direction Z and each of a direction in parallel to the first lateral direction X and in anti-parallel to the first lateral direction X. For example, in the section of the second plateau region 1023 that is arranged external of the second mesa 102, the second plateau region 1023 is in contact with the insulation structure 133 over at least a portion of its total extension DX60 along the first lateral direction X, wherein said portion may be within the range of, e.g., 10% to 100% of DX60. A possibly remaining section of the total lateral extension along the first lateral direction X that is external of the second mesa 101 may be separated from the insulation structure 133 by means of the drift region 100, wherein the distance DZ50 along the extension direction Z may be within the range of 20 nm to 400 nm, within the range of 30 nm to 300 nm, or within the range of 50 nm to 200 nm.

The total lateral extension DX60 may be at least a multiple of the width DX23 of the second mesa 102 (indicated in FIG. 5A), e.g., amounting to a factor within the range of 2 to 1000, within the range of 4 to 700, or within the range of 10 to 500 of DX23. Thus, DX60 can be, e.g., within the range of 40 nm to 10,000 nm, within the range of 80 nm to 7,000 nm, or within the range of 200 nm to 5,000 nm. Further, in the section of the second plateau region 1023 that is arranged external of the second mesa 102, the second plateau region 1023 may exhibit a total extension DZ35 along the extension direction Z, which may be in a similar range as the total extension Z25 (cf. FIG. 5A) of the second mesa 102 along the extension direction Z. For example, DZ35 can be within the range of up to 1,000 nm, within the range of up to 700 nm, or within the range of up to 500 nm. As illustrated in FIG. 7, the DZ35 may vary along the total extension in the first lateral direction X of the second plateau region 1023, e.g., amounting to only DZ30 in the section that may be spaced apart from the insulation structure 133 by said distance DZ50 along the extension direction Z. For example, DZ30 can be within the range of 10 nm to 500 nm, within the range of 20 nm to 400 nm, or within the range of 30 nm to 600 nm.

FIGS. 9A-D each schematically illustrate sections of a horizontal projection of a power semiconductor device 1 in accordance with one or more embodiments. What has been stated above about the embodiments illustrated in FIGS. 1A and 1B may also pertain to the embodiments of FIGS. 9A and 9B, respectively, if not explicitly stated otherwise. For example, the power semiconductor devices 1 shown in FIGS. 9A and 9B each have an active cell field 16 comprising a plurality of cells 14 arranged in a stripe configuration (see FIG. 9A) or in a needle configuration (see FIG. 9B), as described above with reference to FIG. 1A and FIG. 1B, respectively. The active cell field 16 can in each case be surrounded by said edge termination zone 18, which, in the exemplary embodiments of FIGS. 9A and 9B, does not include any active cells. Outside said edge termination zone 18, a further semiconductor zone may be connected (not shown in FIGS. 9A-D) in which the separation between adjacent chips is done. Separation may be done using mechanical dicing, chemical etching, lasering or other means, which may lead to a damaged semiconductor region at or close to the lateral confinement of the power semiconductor device 1.

Figure 9C:
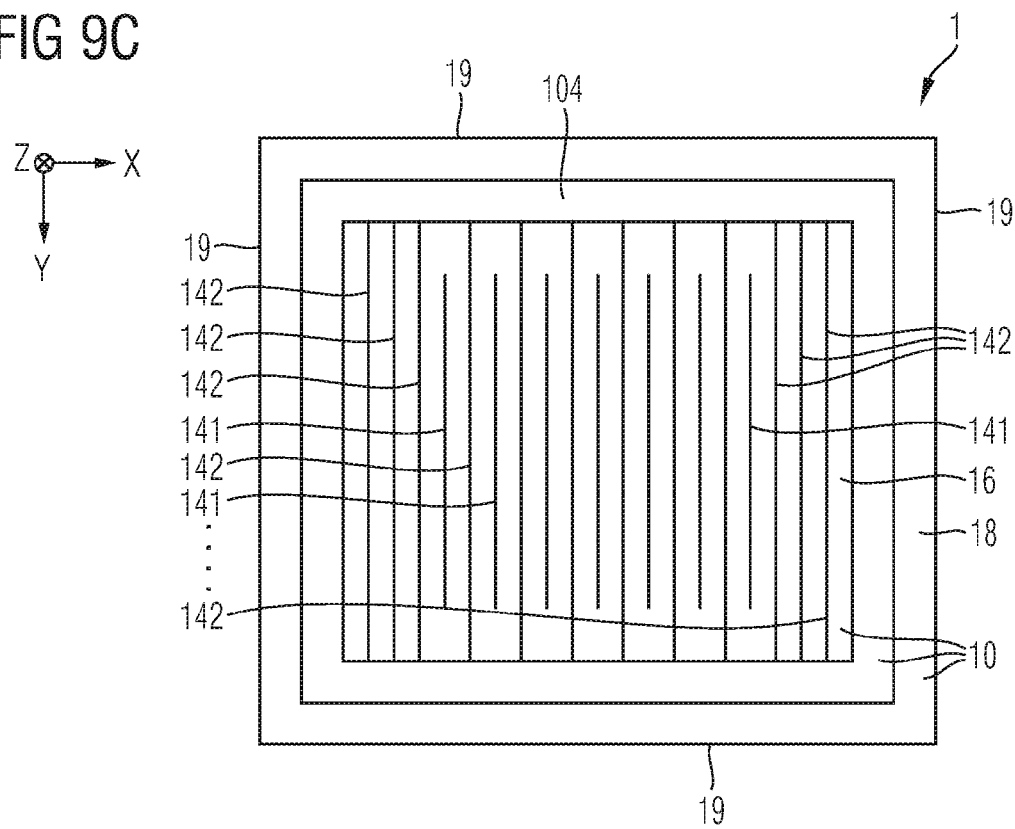

As shown in FIG. 9C, each of the first cells 141 and the second cells 142 may exhibit a stripe configuration, wherein the second cells 142 may extend closer towards the edge termination zone 18 in the lateral direction Y than the first cells 141. Further, in the exemplary embodiment of FIG. 9C, on each side of the semiconductor body 10 with respect to the lateral direction X, the outer stripe cells can be second cells 142 (in the example of FIG. 9C three cells), whereas, in a center of the active cell field 16, first cells 141 and second cells 142 can be arranged in an alternating order.

Figure 9D:
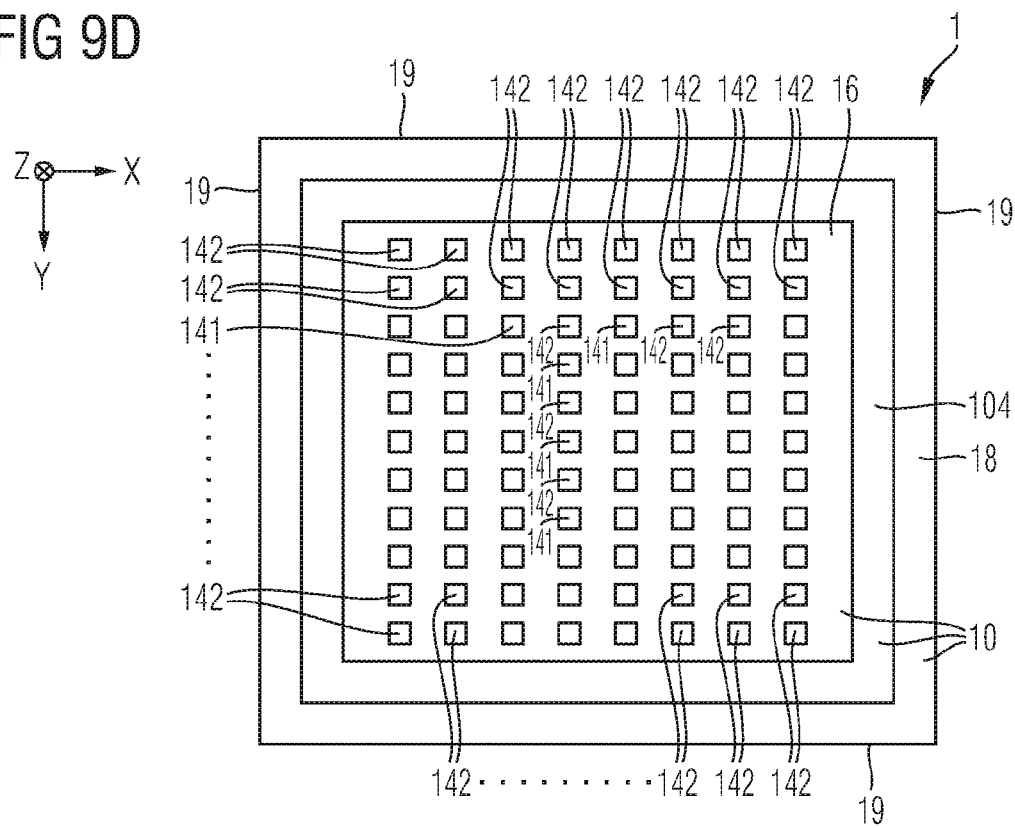

In the embodiment of FIG. 9D, the first cells 141 and the second cells 142 can be arranged in a needle configuration in rows and columns, wherein the outer rows as well as the outer columns are second cells 142. In the example shown in FIG. 9D, two outer rows and two outer columns are second cells 142. In the center of the active cell field 16, the first cells 141 and the second cells 142 can be equally distributed.

Thus, effectively, an area density of the first cells 141 in the center of the active cell field 16 can be greater than an area density of the first cells 141 in the vicinity of the edge termination zone 18 in both embodiments depicted in FIGS. 9C-D. Further, in the vicinity of the edge termination zone 18, an area density of the second cells 142 can be greater than an area density of the first cells 141. Since in the conducting state of the power semiconductor device 1, charge carriers of the first conductivity type can be provided via the first cells 141, an arrangement of the cells as depicted in FIGS. 9C-D may contribute to a reduction of charge carriers in the vicinity of the edge termination zone 18.

In the embodiments of FIGS. 9A-D, the power semiconductor devices 1 in each case may further include a drainage region 104 surrounding the active cell field 16. The drainage region 104 may be arranged between the active cell field 16 and the edge termination zone 18. For example, the drainage region 104 may be configured to reduce a charge carrier concentration in the edge termination zone 18 in the conducting state of the respective power semiconductor device 1.

Figure 10B:
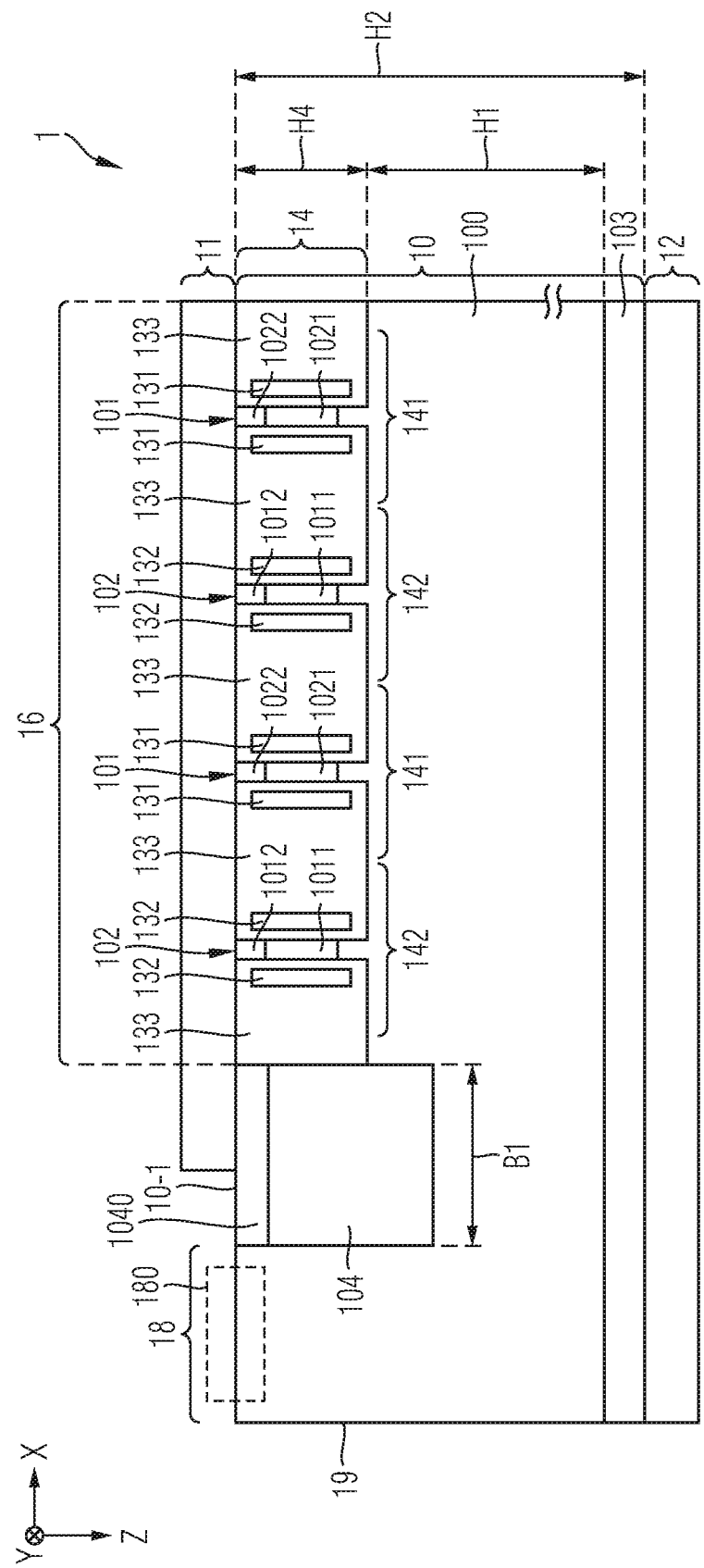

FIGS. 10A and 10B each schematically illustrate a section of a vertical cross-section of an embodiment of the power semiconductor device 1 including said drainage region 104 arranged between the active cell field 16 and the edge termination zone 18. The drainage region 104 can have the second conductivity type and can be electrically connected to the first load terminal structure 11. For example, the drainage region 104 extends from a surface 10-1 of the semiconductor body 10 into the semiconductor body 10 along the extension direction Z, which may be a vertical direction, as depicted in FIGS. 10A-B. The drainage region 104 may be in contact with the first load terminal structure 11, such as with a front side metallization of the first load terminal structure 11, at the surface 10-1 of the semiconductor body 10. For example, as shown in FIGS. 10A-B, the drainage region 104 may extend deeper from the surface 10-1 along the extension direction Z than the insulation structure 133 of the active cells 14, 141, 142.

A lateral extension range B1 of the drainage region 104 along a lateral direction X pointing from the active cell field 16 to the edge termination zone 18 may, for example, amount to at least ⅕, such as at least ⅓, at least ½, or at least ⅔ of the total extension H1 of the drift region 100 along the extension direction Z. Said lateral extension range B1 may even amount to at least the total extension H1 of the drift region 100 along the extension direction Z.

In another embodiment, said lateral extension range B1 of the drainage region 104 along the lateral direction X may amount to at least ⅕, at least ⅓, such as at least ½, or even at least ⅔ of a sum of a total extension H1 of the drift region 100 and the third port region 103, which may for example include a buffer region, along the extension direction Z. For example, said lateral extension range B1 may even amount to at least said joint total extension of the drift region 100 and the third port region 103. In yet a further embodiment, the drainage region 104 may extend along the lateral direction X for a lateral extension range B1 amounting to at least ⅕, at least ⅓, such as at least ½, or even at least ⅔ of a total extension H2 of the semiconductor body 10 along the extension direction Z.

In an embodiment, a concentration of dopants of the second conductivity type inside the drainage region 104 is in the range from $10^{15}$ cm$^{-3}$ to $10^{20}$ cm$^{-3}$, in the range from $10^{16}$ cm$^{-3}$ to $5 \cdot 10^{19}$ cm$^{-3}$, or in the range from $10^{17}$ cm$^{-3}$ to $10^{19}$ cm$^{-3}$. For example, the drainage region 104 may have been created by diffusion of dopants of the second conductivity type from the surface 10-1 and/or by implantation of dopants of the second conductivity type from a front side of the semiconductor body 10 through the surface 10-1. For example, the drainage region 104 may have been created, e.g., by implantation and/or a diffusion of dopants of the second conductivity type, together with the first and/or second channel regions 1012, 1022 in a common process step. For example, the drainage region 104 on the one hand and the first and/or second channel region 1012, 1022 on the other hand may exhibit essentially the same concentration of dopants of the second conductivity type.

In an embodiment, as shown in FIG. 10B, a fourth port region 1040 may be provided within the drainage region 104 for establishing a low ohmic electrical connection with the first load terminal structure 11. For example, the fourth port region 1040 is arranged in contact with the first load terminal structure 11 and exhibits the second conductivity type at the higher dopant concentration than the drainage region 104 external of the fourth port region 1040. For example, the fourth port region 1040 may have been created, e.g., by a masked implantation and/or diffusion of dopants of the second conductivity type, in a common process step together with the second port regions 1021. Accordingly, the fourth port region 1040 and the second port regions 1021 may exhibit essentially the same concentration of dopants of the second conductivity type. An extension range of the fourth port region 1040 along the lateral directions X, Y may be different from the drainage region 104. For example, the fourth port 1040 region may only be present in areas where the drainage region 104 is in contact with the first load terminal structure 11.

Figure 11A:
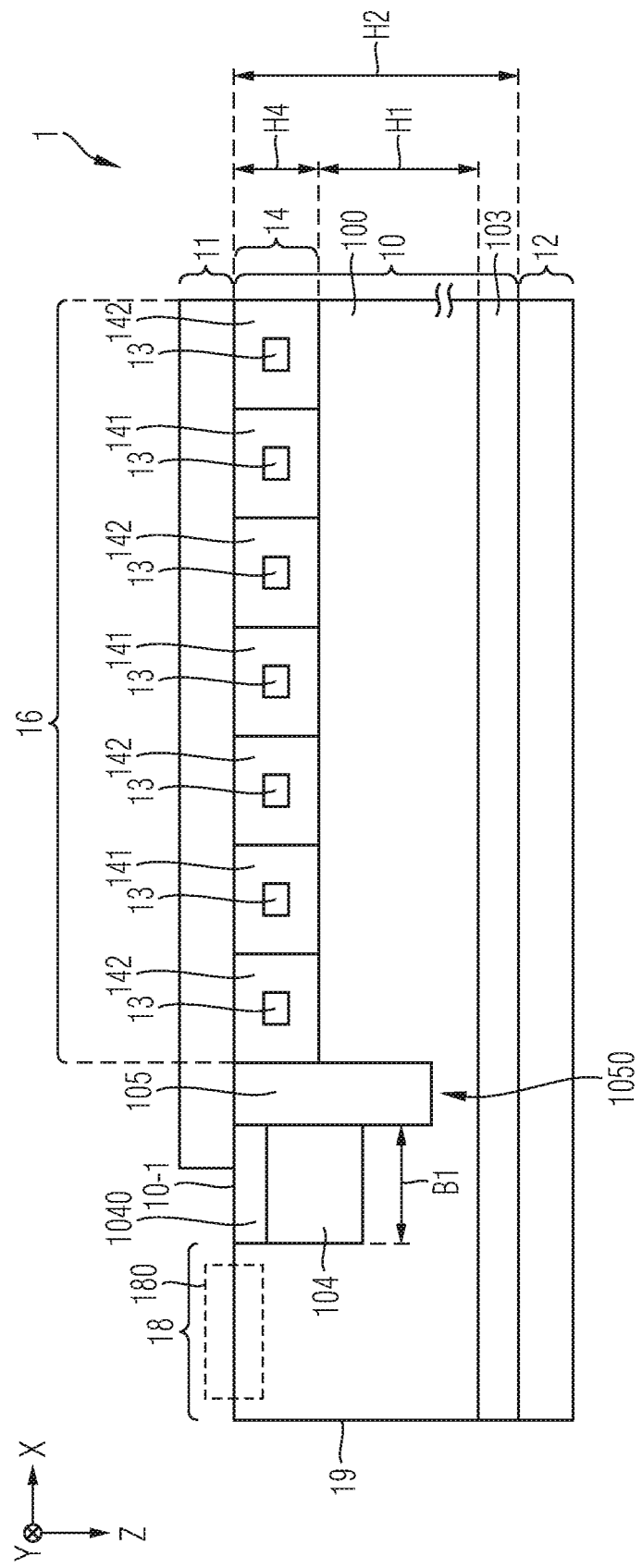
FIGS. 11A-B each schematically illustrate a section of a vertical cross-section of a power semiconductor device in accordance with one or more embodiments.
Figure 11B:
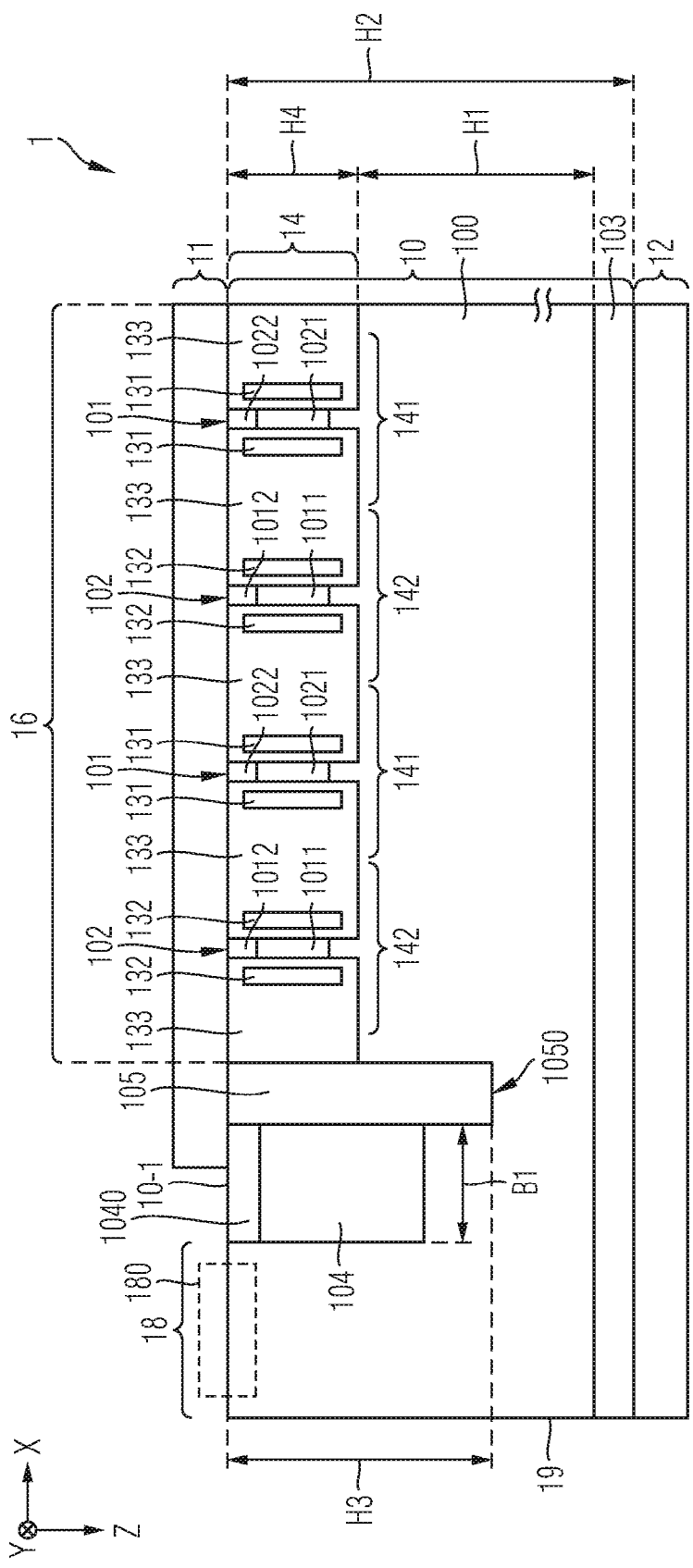

FIGS. 11A and 11B each schematically illustrate sections of a vertical cross-section of a power semiconductor device 1 in accordance with further embodiments. There, in addition to said drainage region 104 described above with reference to FIGS. 9A-10B, a diffusion barrier region 105 may be provided between said drainage region 104 and the active cell field 16. The diffusion barrier region 105 may be configured to hinder diffusion of charge carriers from the drift region 100 below the active cell field 16 towards the edge termination zone 18. Thus, the diffusion barrier region 105 may contribute to a reduction of the charge carrier density below the edge termination zone 18 and/or a lower reduction of the charge carrier density below the cells adjacent to the edge termination zone 18 compared to cells in the center of the power semiconductor device 1 in the conducting state of the power semiconductor device 1.

As shown in FIGS. 11A-B, the diffusion barrier region 105 may extend into the semiconductor body 10 from the surface 10-1 along the extension direction Z, e.g., a vertical direction. For example, the diffusion barrier region 105 may be arranged adjacent to the drainage region 104 on the one side and/or to an outer second cell 142 of the active cell field 16 on another side. In another embodiment (not depicted), the diffusion barrier region 105 may instead be arranged adjacent to an outer first cell 141 of the active cell field 16. In yet a further embodiment (not depicted) the diffusion barrier region 105 may be arranged at a lateral distance from an outer first or second cell 141, 142 of the active cell field 16 and/or from the drainage region 104.

The diffusion barrier region 105 may extend from the surface 10-1 along said extension direction Z deeper than each of the first mesa 101 and the second mesa 102 of the first and second cells 141, 142. The diffusion barrier region 105 may extend from the surface 10-1 along said extension direction Z even deeper than the first and second cells 141, 142, such as deeper than the insulation structure 133, and/or deeper than the drainage region 104, as shown in FIG. 11B. For example, a total extension H3 of the diffusion barrier region 105 along the extension direction Z and/or an extension H4 of the diffusion barrier region 105 along the extension direction Z below the insulation structure 133 amounts to at least ⅕, such as at least ⅓, at least ½, or even at least ⅔ of the total extension H2 of the semiconductor body 10 along the extension direction Z. Alternatively, said total extension H3 of the diffusion barrier region 105 and/or said extension H4 of the diffusion barrier region 105 below the insulation structure 133 may amount to at least ⅕, such as at least ⅓, at least ½, or even at least ⅔ of an extension range H1 along the extension direction Z of the drift region 100 below the insulation structure 133.

The diffusion barrier region 105 may, for example, comprise a dielectric material, such as an oxide. In an embodiment, the diffusion barrier region 105 is formed by a trench 1050 extending from the surface 10-1 into the semiconductor body 10 along the extension direction Z, wherein the trench 1050 is at least partially filled with said dielectric material. For example, the diffusion barrier region 105 may have come into being by creating said trench 1050 within the semiconductor body 10 and subsequently filling the trench 1050 at least partially with an oxide.

Figure 12A:
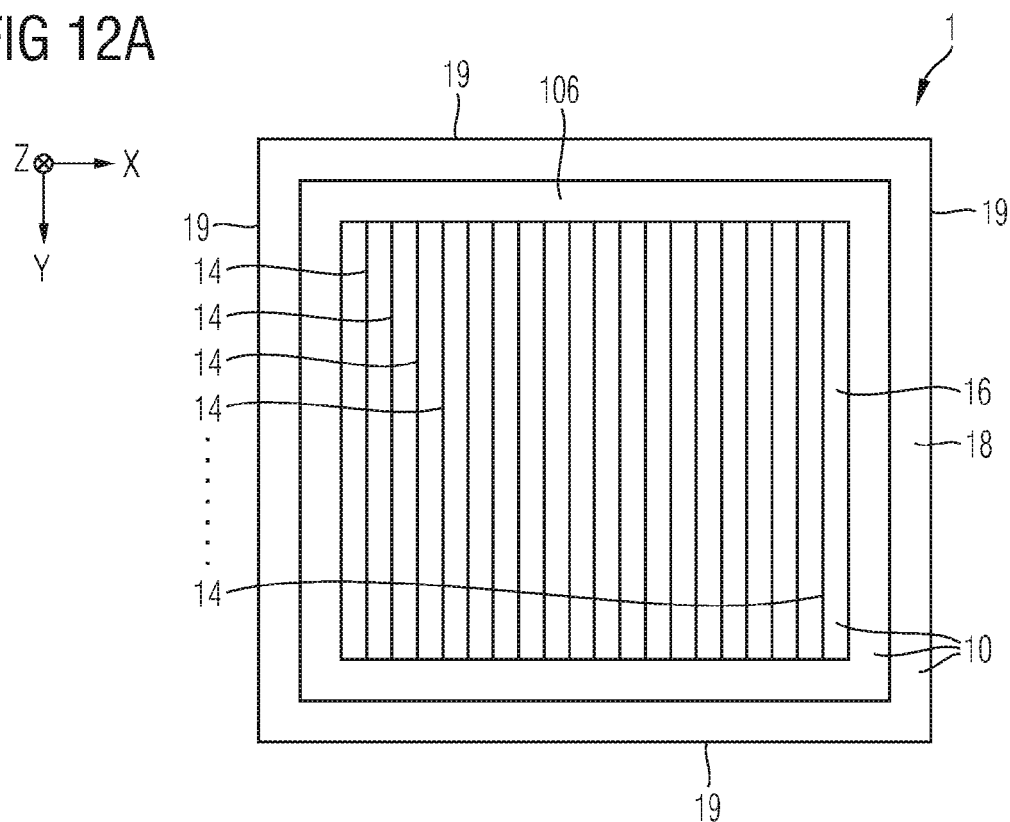
FIGS. 12A-B each schematically illustrate a section of a horizontal projection of a power semiconductor device in accordance with one or more embodiments.
Figure 12B:
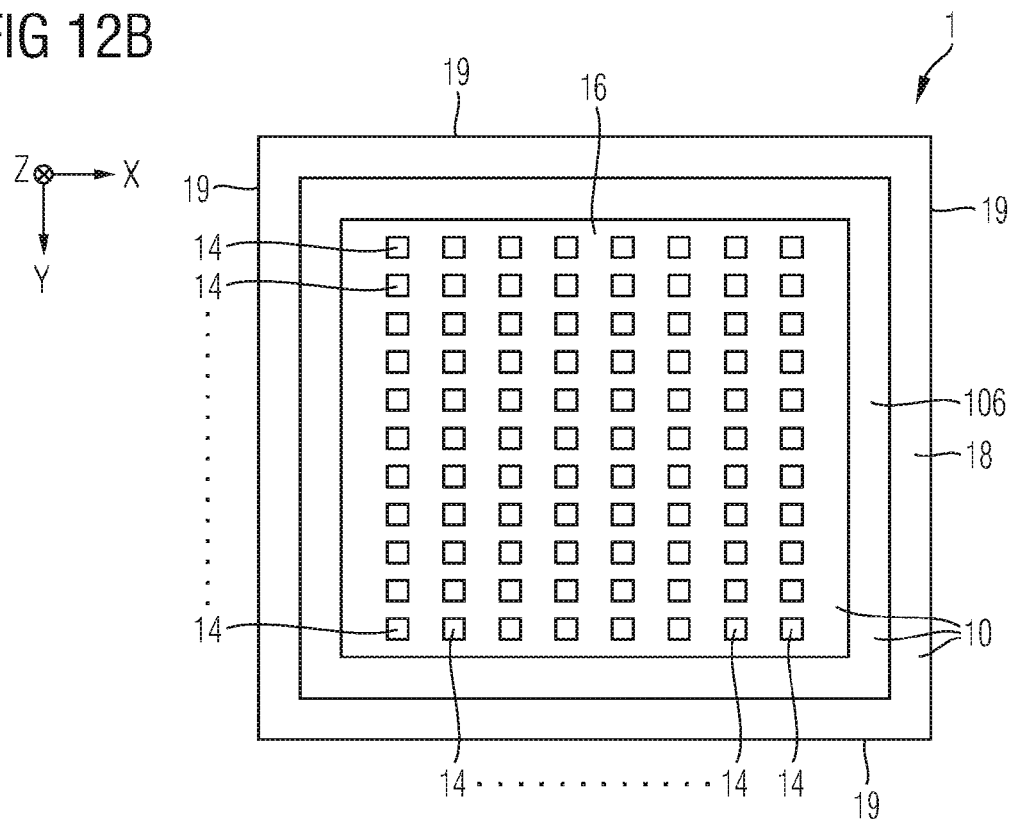

FIGS. 12A and 12B each schematically illustrate sections of a horizontal projection of the power semiconductor device 1 in accordance with further embodiments. There, the active cell field 16 may be surrounded by a recombination region 106, which is arranged between the active cell field 16 and the lateral edges 19 of the semiconductor body 10. The recombination region 106 may be configured to ensure that a charge carrier lifetime of charge carriers of the first conductivity type and/or of charge carriers of the second conductivity type inside the recombination region 106 is less than a charge carrier lifetime of charge carriers of the respective conductivity type inside the drift region 100.

For example, a charge carrier lifetime inside the recombination region 106 may be less than a corresponding charge carrier lifetime inside the drift region 100 by a factor of at least 10 or at least 50, such as at least 100, or even at least 1000. For example, inside the recombination region 106, an ambipolar charge carrier lifetime, which characterizes a decay of electron and hole populations over time due to electron-hole recombination, may be less than 100 μs, such as less than 60 μs, less than 7 μs, less than 1 μs, or even less than 0.1 μs.

Accordingly, an ambipolar diffusion length inside the recombination region 106 may be smaller than an ambipolar diffusion length inside the drift region 100 below the active cell field 16 by a factor of at least 10 or at least 50, such as at least 100, or even at least 1000. For example, the ambipolar diffusion length inside the recombination region 106 may be less than 10 μm, such as less than 5 μm, less than 1 μm, or even less than 0.5 μm.

In an embodiment, the ambipolar diffusion length inside the recombination region 106 may be less than the total extension H1 of the drift region 100 along the extension direction Z at least by a factor of 10, such as at least by a factor of 50, at least by a factor of 1000, or even at least by a factor of 1000.

Figure 13A:
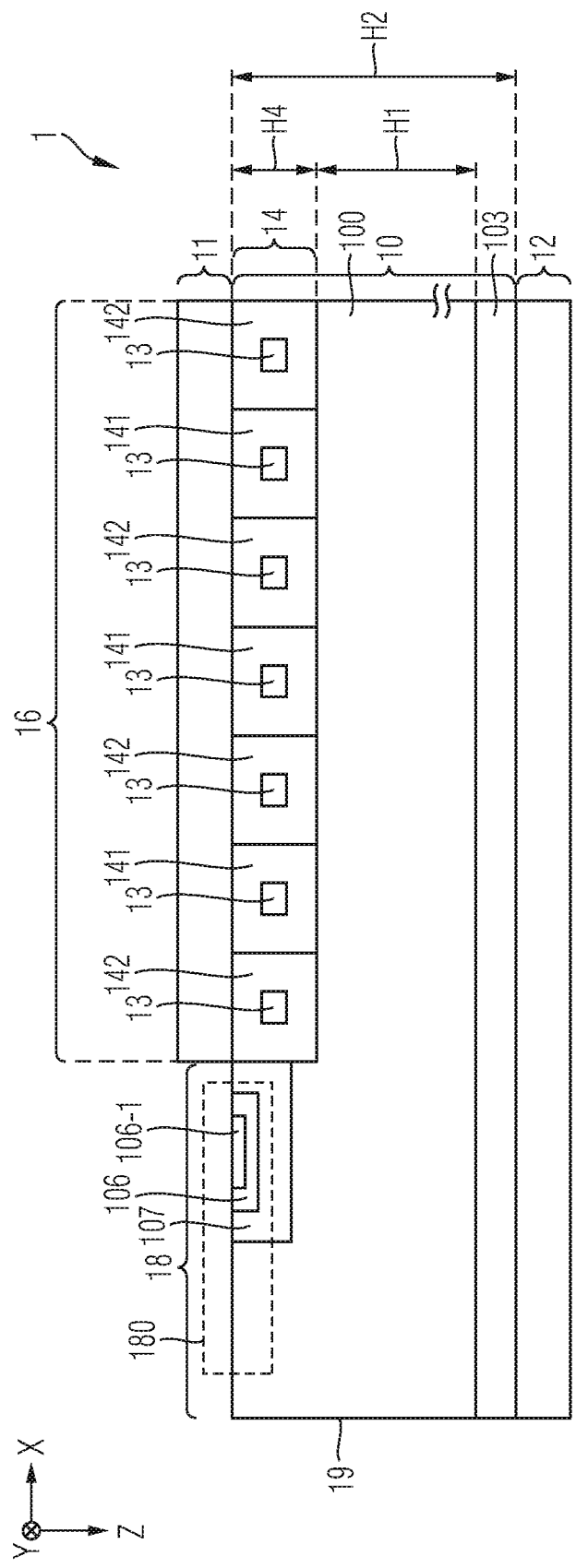

FIGS. 13A and 13B each schematically illustrate a section of a vertical cross-section of a power semiconductor device 1 having the recombination region 106 arranged between the active cell field 16 and the edge termination zone 18. As depicted in FIGS. 13 A-B, the recombination region 106 may be arranged adjacent to the surface 10-1 of the semiconductor body 10. For example, a metal region 106-1 may be arranged adjacent to the recombination region 106, as depicted in FIGS. 13A-B. For example, the metal region 106-1 may be located at least partially inside the semiconductor body 10 and/or located at least partially above the semiconductor body 10. For example, the presence of said metal region 106-1 may induce electron-hole recombination and thus lead to a reduced ambipolar charge carrier lifetime. For example, the metal region 106-1 is electrically floating.

Additionally or alternatively, the recombination region 106 may comprise and/or may be arranged adjacent to a crystalline material having a substantial amount of crystal defects. For example, such a crystalline material having a substantial amount of crystals defects may be arranged at the surface 10-1 adjacent to the recombination region 106 in an analogous manner as the metal region 106-1 in FIGS. 13A-B. For example, such defects may have been produced via irradiation of ions and/or electrons from the front side of the semiconductor body 10 through the surface 10-1. Such crystal defects may also be present within the recombination region 106.

In a variant, the recombination region 106 may comprise heavy metal dopants, such as platinum atoms, functioning as recombination centers. For example, such heavy metal dopants may be implanted into the semiconductor body 10 or deposited on the semiconductor body 10 and may be subsequently diffused.

In a further embodiment, such heavy metal atoms may be provided not only within a dedicated recombination region 106, but essentially homogeneously over a lateral extension of the semiconductor body 10.

In an embodiment, the recombination region 106 may be embedded within a semiconductor protection region 107 having the second conductivity type, as shown in FIGS. 13A-B. For example, the semiconductor protection region 107 may have dopants of the second conductivity type in a range from $10^{14}$ cm$^{-3}$ to $10^{17}$ cm$^{-3}$, such as in a range from $10^{14}$ cm$^{-3}$ to $10^{16}$ cm$^{-3}$. For example, the integral of the dopants of the second conductivity type in a direction Z as indicated in FIGS. 13A-B may exceed a dose of $10^{12}$ cm$^{-2}$ or of $2 \cdot 10^{12}$ cm$^{-2}$. The semiconductor protection region 107 may isolate the recombination region 106 from the drift region 100 and may be configured to prevent an electric field from reaching the recombination region 106 in the blocking state of the power semiconductor device 1.

In an embodiment, the recombination region 106 may be integrated in an edge termination structure 180 provided within the edge termination zone 18. FIGS. 13A and 13B each schematically illustrate such an edge termination structure 180 arranged inside the edge termination zone 18. The edge termination structure 180 may be configured and arranged to reduce an electric field in the vicinity of an edge 19 of the semiconductor body 10 in the blocking state of the power semiconductor device 1. For example, the edge termination zone 18 may include at least one of the following kinds of edge termination structures 180:

A variation of lateral doping (VLD), wherein a semiconductor region having the second conductivity type is provided in the vicinity of the surface 10-1 of the semiconductor body 10. Said semiconductor region surrounds the active cell field 16 and exhibits a concentration of dopants of the second conductivity type that decreases at least in sections continuously towards the edge 19. For example, the integral of the dopants of the second conductivity type in a direction Z in said semiconductor region may be lower than a dose of $5 \cdot 10^{12}$ cm$^{-2}$ or of $2 \cdot 10^{12}$ cm$^{-2}$ or of $1 \cdot 10^{12}$ cm$^{-2}$. In addition, between said semiconductor region having the second conductivity type and the edge 19, there may be arranged a semiconductor region having the first conductivity type in the vicinity of the surface 10-1.

A junction termination extension (JTE), wherein a semiconductor region having the second conductivity type is provided in the vicinity of the surface 10-1, said semiconductor region surrounding the active cell field 16 and exhibiting a concentration of dopants of the second conductivity type that decreases step-wise towards the edge 19. For example, the integral of the dopants of the second conductivity type in a direction Z in these sections may be lower than a dose of $5 \cdot 10^{12}$ cm$^{-2}$ or of $2 \cdot 10^{12}$ cm$^{-2}$ or of $1 \cdot 10^{12}$ cm$^2$. In addition, a semiconductor region having the first conductivity type may be arranged between said semiconductor region having the second conductivity type and the edge 19 in the vicinity of the surface 10-1;

A field ring or a plurality of a field rings, which may each be implemented as a semiconductor region having the second conductivity type and surrounding the active cell field 16. The field rings may follow a round curve in the vicinity of corners of the semiconductor body 10 so as to avoid the occurrence of excessive values of an electric field in the blocking state of the power semiconductor device 1;

A field plate or a plurality of field plates, which may each be implemented in the form of a stripe of a highly conductive material that is arranged above the surface 10-1 of the semiconductor body 10 and is insulated from the semiconductor body 10 by a dielectric material. The field plate or the field plates may surround the active cell field 16. In the case of a plurality of field plates, a thickness of the dielectric material may increase and/or decrease continuously and/or step-wise with an increasing distance from the active cell field 16. Such field plates may be either electrically floating or may be connected to the semiconductor body 10 at certain points or along certain lines so as to assume an electrical potential prevailing locally at the point or line of connections;

An electro-active cover layer, which may be applied to the surface 10-1 so as to surround the active cell field 16. Optionally, a dielectric insulation layer may be provided between the surface 10-1 and the electro-active cover layer. For example, the electro-active cover layer may comprise at least one of diamond-like carbon (DLC) and amorphous hydrogen-doped carbon (a-C:H). Under the influence of an external electric field, a charge state of the impurities provided within the electro-active layer may be changed, which may mitigate an influence of external electric fields and/or ions on the semiconductor body 10. For example, a lateral edge of the electro-active layer may be electrically connected with an electrical potential of the channel regions 1012, 1022 of the cells 14, 141, 142 and/or of an outer edge 19 of the semiconductor body 10;

A semi-insulating cover layer, which may be applied to the surface 10-1 so as to surround the active cell field 16. Optionally, a dielectric insulation layer may be provided between the surface 10-1 and the semi-insulating cover layer. For example, the semi-insulating cover layer may comprise at least one of semi-insulating amorphous or polycrystalline silicon and a semi-insulating glass, or the like. The semi-insulating cover layer may be connected on the one side with an electrical potential of the channel regions 1012, 1022 and on the other side with an electrical potential of an outer edge 19 of the semiconductor body 10. As a result, in the blocking state of the power semiconductor device 1, a small lateral current may constantly flow through the semi-insulating cover layer so as to produce an approximately linear course of an electrical potential within the semi-insulating cover layer. Thus, a defined potential may be provided within the semiconductor body 10 below the semi-insulating cover layer and/or an influence of nearby ions on the semiconductor body 10 may be mitigated;

A vertical edge termination, which may have come into being by creating at least one trench within the semiconductor body 10, wherein the at least one trench surrounds the active cell field 16. For example, the at least one trench may be filled at least partially with the dielectric material and may extend from the surface 10-1 down to at least 20% of an extension H1 of the drift region 100 along the extension direction Z, or even down to the back side of the semiconductor body 10. In a variant referred to as "bevel edge termination", an extension direction of the at least one trench may deviate from a direction Z that is perpendicular to the surface 10-1.

The different kinds of edge termination structures 180 described above may be applied separately or in combination with each other. For example, field plates are combined with p-type field rings or JTE edge termination structures, and electro-active or semi-insulating cover layers may be combined with VLD-type edge termination structures, to name only a few possibilities.

In an embodiment, a channel stopper can be provided at a transition between the edge termination structure 180 and an outer edge 19 of the semiconductor body 10. The channel stopper may be implemented as a semiconductor region having the first conductivity type at a medium to high concentration level, wherein said semiconductor region surrounds the active cell field 16. Alternatively, the channel stopper may be implemented as one or more field plates surrounding the active cell field 16, wherein the field plate is situated at least locally close above the surface 10-1 and is electrically connected with an electrical potential of an outer edge 19 of the semiconductor body 10. In the case of a plurality of field plates, a thickness of the dielectric material may decrease continuously and/or step-wise with an increasing distance from the active cell field 16.

Additionally, a chipping stopper may be provided between said channel stopper and an outer edge 19 of the semiconductor body 10. The chipping stopper may be configured to prevent a proliferation of crystal damages, which may, for example, originate from the sawing of semiconductor chips. The chipping stopper may be implemented in the form of laterally confined thick portions of silicon dioxide arranged on the surface 10-1, which surround the active cell field 16. Below said portions of silicon dioxide, the semiconductor body 10 may experience a stress and/or a strain that is different from the stress and/or strain that is present in the surrounding portions of the semiconductor body 10.

Alternatively or additionally, trenches may be provided in the semiconductor body 10, which may be configured to prevent the proliferation of crystal damages and/or cracks in the vicinity of the surface 10-1.

Further, a dielectric layer arranged above the surface 10-1 may be laterally interrupted along a line that surrounds the edge termination structure 180 so as to prevent the proliferation of damages and/or cracks of the dielectric layer from the edge 19 towards the edge termination structure 180. Such interruptions within the dielectric layer may or may not be filled with a conductive material similar to contact holes.

The recombination region 106 may be integrated, for example, within each kind of edge termination structures 180 described above, or within any combination thereof.

Further, the recombination region 106 may be combined with a diffusion barrier 105, as described above with respect to the drainage region 104, and/or with a drainage region 104.

FIG. 14 shows a section of a vertical cross-section of a further embodiment of a power semiconductor device 1 comprising a drainage region 104 and a recombination region 106, the recombination region 106 being arranged between said drainage region 104 and an edge 19 of the semiconductor body 10. Further, a diffusion barrier region 105 is provided between the active cell field 16 and the drainage region 104.

In an embodiment, a power semiconductor device 1 comprising a drainage region 104, a recombination region 106, and/or a diffusion barrier region 105 may exhibit an arrangement of first cells 141 and second cells 142, wherein an area density of the first cells 141 in the center of the active cell field 16 is greater than an area density of the first cells 141 in the vicinity of the edge termination zone 18 and/or wherein in the vicinity of the edge termination zone 18, an area density of the second cells 142 is greater than an area density of the first cells 141, as explained above with regard to the exemplary embodiments of FIGS. 9C-D.

Figure 15:
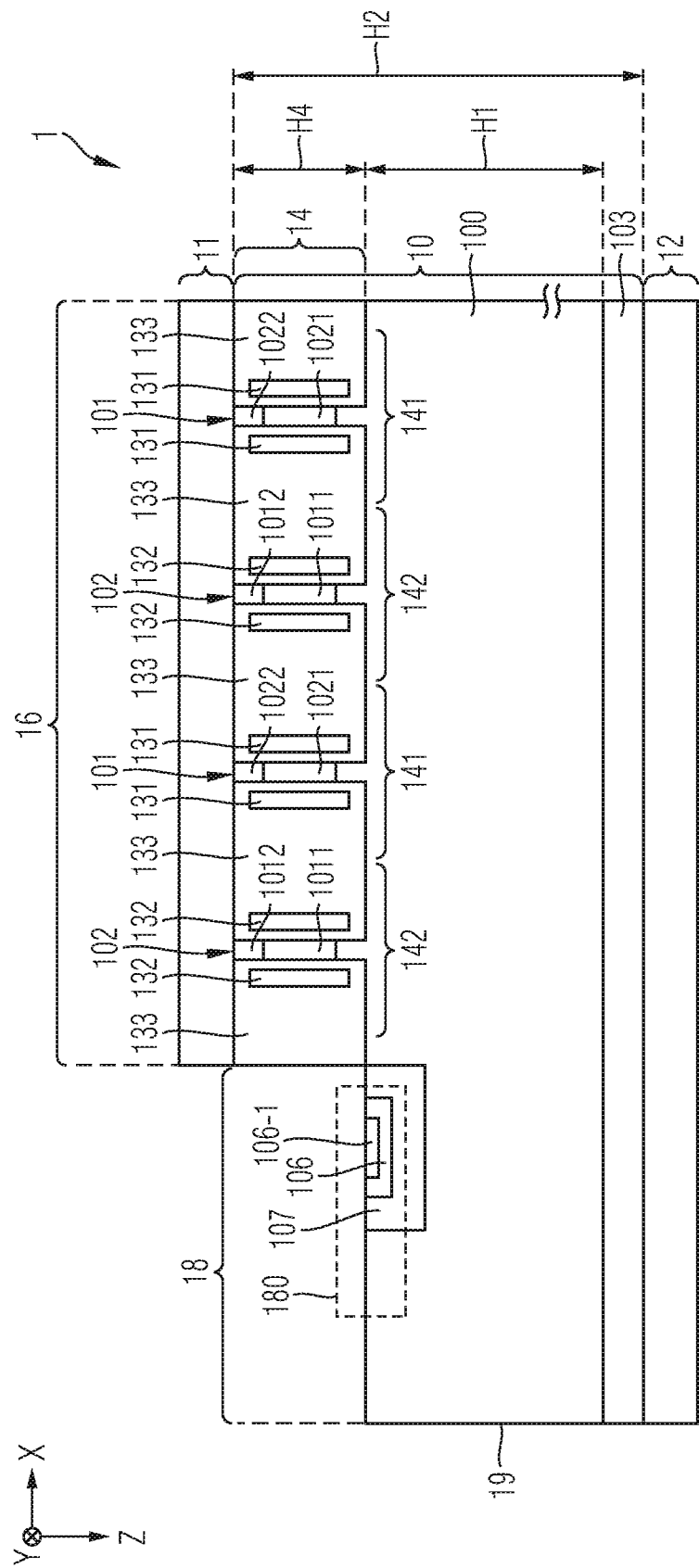
FIG. 15 schematically illustrates a section of a vertical cross-section of a power semiconductor device in accordance with one or more embodiments.

FIG. 15 schematically illustrates a section of a vertical cross-section of a further embodiment of a power semiconductor device 1, wherein the semiconductor surface 10-1 may exhibit a step-structure, according to which the edge termination zone 18 comprising the edge termination structure 180 and optionally the recombination region 106 may be displaced from the first load terminal structure 11 along the extension direction Z by a minimum distance. For example, the edge termination zone 18 is situated lower by a vertical extension H4 of the insulation structure 133. For example, such a topography of the surface 10-1 may have come into being in the following manner: In a first step, trenches may be created, the trenches extending into the semiconductor body 10 from the (initially flat) surface 10-1 along the extension direction Z, e.g., a vertical direction. The first mesa 101 and the second mesa 102 may be defined as the semiconductor regions remaining in-between said trenches, wherein the trenches may be provided for accommodating the insulation structure 133. For example, the creation of such trenches may involve an etch process, which may be carried out homogeneously over the lateral extension of the semiconductor body 10. In a subsequent step, first and second mesas 101, 102 may be removed in the edge termination zone 18, e.g., by a masked etch process. In a further step, the structures inside the edge termination zone 18, such as an edge termination structure 180, a diffusion barrier region 105, a drainage region 104, and/or a recombination region 106 (as exemplarily depicted in FIG. 15) may be created.

Further, it should be noted that one or more pads, such as, e.g. gate pads and/or sensor pads, may be arranged at the front side 10-1 of the semiconductor body 10. For example, one or more sensor pads may be provided, e.g. for temperature sensing, current sensing, or for providing and/or receiving other signals to enable possible further integrated electric functions of the power semiconductor device 1. Such pads may be at least partially surrounded by said recombination region 106 and/or by said drainage region 104. For example, such pads may be arranged adjacent to the edge termination zone 18, such that the recombination region 106 and/or the drainage region 104 isolate the pads from the active cell field 16 with respect to at least one lateral direction X, Y.

The embodiments schematically illustrated in the drawings and described above include the recognition that, in order to prevent a failure of a power semiconductor device, for example during switch-off, it may be desirable to prevent an occurrence of an excessive current density in the vicinity of an edge termination zone of the power semiconductor device. Often, a backside emitter, e.g. of a vertical IGBT, is not contacted in regions below an edge termination structure so as to decrease a current density in those regions in a conducting state of the power semiconductor device, thereby protecting the edge termination structure during switch-off. However, in the case of power semiconductor devices having a fully depletable channel region, a charge carrier density in the conducting state may be mostly concentrated in the vicinity of a front side of the power semiconductor device, such that protective measures relying on properties of the backside emitter, as described above, may have a limited effect. Therefore, it may be desirable to provide protective measures that may affect the bulk of the charge carrier density in the vicinity of the front side.

In accordance with an embodiment, an active cell field of a power semiconductor device having fully depletable channel regions is surrounded by a drainage region which is arranged between the active cell field and an edge termination zone, the drainage region being electrically connected with a first load terminal structure. For example, the drainage region may comprise p-type dopants and may be configured to drain holes via a front side metallization of the first load terminal structure so as to reduce the charge carrier density in the edge termination zone.

In accordance with another embodiment, the active cell field may be surrounded by a recombination region that is arranged between the active cell field and lateral edges of the semiconductor body. A charge carrier lifetime inside the recombination region may be less than a charge carrier lifetime inside the drift region by a factor of at least 50 so as to reduce the charge carrier density. For example, a metal region may be arranged adjacent to the recombination region, wherein the presence of said metal region may induce electron-hole recombination and thus lead to a reduced ambipolar charge carrier lifetime. Additionally or alternatively, the recombination region may comprise and/or may be arranged adjacent to a crystalline material having a substantial amount of crystal defects. In a variant, the recombination region comprises heavy metal dopants, such as platinum atoms, functioning as recombination centers. Such a recombination region may be integrated in an edge termination structure provided inside the edge termination zone.

In accordance with a variant that combines the embodiments described above, the active cell field may be surrounded by a drainage region as described above, the drainage region being in turn surrounded by a recombination region.

Further, a diffusion barrier region may be arranged between the active cell field and the drainage region and/or between the active cell field and the recombination region. The diffusion barrier region may be configured to hinder diffusion of charge carriers from the drift region below the active cell field towards the edge termination zone.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to a power semiconductor device and to methods of processing a power semiconductor device were explained. For example, these embodiments are based on silicon (Si). Accordingly, a monocrystalline semiconductor region or layer, e.g., the semiconductor regions 10, 100, 101, 1011, 1012, 1013, 102, 1021, 1022, 1023, 1033, 104, 1040, 106, 107 of exemplary embodiments, can be a monocrystalline Si-region or Si-layer. In other embodiments, polycrystalline or amorphous silicon may be employed.

It should, however, be understood that the semiconductor regions 10, 100, 101, 1011, 1012, 1013, 102, 1021, 1022, 1023, 1033, 104, 1040, 106, 107 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1−x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
a semiconductor body coupled to a first load terminal structure and a second load terminal structure;
an active cell field implemented in the semiconductor body and configured to conduct a load current, the active cell field being surrounded by an edge termination zone;
a plurality of first cells and a plurality of second cells provided in the active cell field, each being configured for controlling the load current and each being electrically connected to the first load terminal structure on the one side and electrically connected to a drift region of the semiconductor body on the other side, the drift region comprising dopants of a first conductivity type;
wherein:
each first cell comprises a first mesa, the first mesa including: a first port region having dopants of the first conductivity type and being electrically connected with the first load terminal structure, and a first channel region being coupled to the drift region;
each second cell comprises a second mesa, the second mesa including: a second port region having dopants of a second conductivity type and being electrically connected with the first load terminal structure, and a second channel region being coupled to the drift region;
each first mesa and each second mesa are spatially confined, in a direction perpendicular to a direction of the load current within the respective mesa, by an insulation structure and exhibit a total extension of less than 100 nm in said direction perpendicular to said direction of the load current;
and wherein
the active cell field is surrounded by a drainage region which is arranged between the active cell field and the edge termination zone, the drainage region having dopants of the second conductivity type and being electrically connected with the first load terminal structure.

2. The power semiconductor device of claim 1, wherein a concentration of dopants of the second conductivity type inside the drainage region is in the range from $10^{15}$ cm$^{-3}$ to $10^{20}$ cm$^{-3}$.

3. A power semiconductor device, comprising:
a semiconductor body coupled to a first load terminal structure and a second load terminal structure;
an active cell field implemented in the semiconductor body and configured to conduct a load current, the active cell field being surrounded by an edge termination zone;
a plurality of first cells and a plurality of second cells provided in the active cell field, each being configured for controlling the load current and each being electrically connected to the first load terminal structure on the one side and electrically connected to a drift region of the semiconductor body on the other side, the drift region having a first conductivity type;
wherein:
each first cell comprises a first mesa, the first mesa including: a first port region having the first conductivity type and being electrically connected with the first load terminal structure, and a first channel region being coupled to the drift region;
each second cell comprises a second mesa, the second mesa including: a second port region having a second conductivity type and being electrically connected with the first load terminal structure, and a second channel region being coupled to the drift region;
each first mesa and each second mesa are spatially confined, in a direction perpendicular to a direction of the load current within the respective mesa, by an insulation structure and exhibit a total extension of less than 100 nm in said direction perpendicular to said direction of the load current;
and wherein
the active cell field is surrounded by a recombination region which is arranged between the active cell field and at least one lateral edge of the semiconductor body, wherein a charge carrier lifetime inside the recombination region is less than a charge carrier lifetime inside the drift region by a factor of at least 50.

4. The power semiconductor device of claim 3, wherein an ambipolar diffusion length inside the recombination region is smaller than an ambipolar diffusion length inside the drift region below the active cell field by a factor of at least 10.

5. The power semiconductor device of claim 3, wherein an ambipolar diffusion length inside the recombination region is smaller than a total extension of the drift region along an extension direction pointing from the first load terminal structure to the second load terminal structure at least by a factor of 10.

6. The power semiconductor device of claim 3, wherein a metal region is arranged adjacent to the recombination region.

7. The power semiconductor device of claim 3, wherein the recombination region comprises and/or is arranged adjacent to a crystalline material having a substantial amount of crystal defects.

8. The power semiconductor device of claim 3, wherein the recombination region comprises heavy metal dopants.

9. The power semiconductor device of claim 3, wherein the recombination region is electrically floating.

10. The power semiconductor device of claim 3, wherein the recombination region is embedded within a semiconductor protection region having the second conductivity type, wherein the semiconductor protection region isolates the recombination region from the drift region.

11. The power semiconductor device of claim 3, wherein the active cell field is further surrounded by a drainage region which is arranged between the active cell field and the edge termination zone, the drainage region having the second conductivity type and being electrically connected to the first load terminal structure.

12. The power semiconductor device of claim 1, wherein a diffusion barrier region is arranged between the active cell field and the drainage region and/or between the active cell field and the recombination region, the diffusion barrier region being configured to hinder diffusion of charge carriers from the drift region below the active cell field towards the edge termination zone.

13. The power semiconductor device of claim 12, wherein the diffusion barrier region extends from a surface of the semiconductor body along an extension direction deeper than each of the first mesa and the second mesa.

14. The power semiconductor device of claim 12, wherein a total extension range of the diffusion barrier region along the extension direction amounts to at least ¼ of a total extension range of the semiconductor body along the extension direction.

15. The power semiconductor device of claim 12, wherein the diffusion barrier region is formed by a trench extending from a surface of the semiconductor body into the semiconductor body along the extension direction, wherein the trench is at least partially filled with an oxide.

16. The power semiconductor device of claim 1, wherein an area density of the first cells in the center of the active cell field is greater than an area density of the first cells in the vicinity of the edge termination zone.

17. The power semiconductor device of claim 1, wherein, in the vicinity of the edge termination zone, an area density of the second cells is greater than an area density of the first cells.

18. The power semiconductor device of claim 1, wherein each of the first cells and the second cells exhibit a stripe configuration extending substantially in parallel to one another along a lateral direction, and wherein the second cells extend closer towards the edge termination zone in the lateral direction than the first cells.

19. The power semiconductor device of claim 1, wherein the semiconductor body further comprises a plateau region having the second conductivity type and being arranged between the second channel region and the semiconductor drift region and extending deeper into the semiconductor body than the second mesa, wherein, in a section arranged deeper than the second mesa, the plateau region extends laterally from the second mesa towards the first mesa, a lateral extension of the section in this direction being at least 50% of the distance between the first and second mesa.

20. The power semiconductor device of claim 1, wherein the edge termination zone comprises an edge termination structure that is displaced from the first load terminal structure along the extension direction by a minimum distance.

* * * * *